US011133753B2

(12) United States Patent
    Kaeriyama

(10) Patent No.: US 11,133,753 B2
(45) Date of Patent: Sep. 28, 2021

(54) POWER CONTROL CIRCUIT

(71) Applicant: RENESAS ELECTRONICS CORPORATION, Tokyo (JP)

(72) Inventor: Shunichi Kaeriyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 16 days.

(21) Appl. No.: 16/513,113

(22) Filed: Jul. 16, 2019

(65) Prior Publication Data
    US 2019/0341861 A1    Nov. 7, 2019

Related U.S. Application Data

(63) Continuation of application No. 15/585,204, filed on May 3, 2017, now abandoned, which is a continuation
    (Continued)

(30) Foreign Application Priority Data

Sep. 19, 2014    (JP) .................... 2014-190820

(51) Int. Cl.
    *H02M 7/5387*    (2007.01)
    *H03K 17/687*    (2006.01)
    (Continued)

(52) U.S. Cl.
    CPC ......... *H02M 7/5387* (2013.01); *H02M 1/084* (2013.01); *H03K 17/687* (2013.01); *G01R 19/0092* (2013.01); *H02M 1/0009* (2021.05)

(58) Field of Classification Search
    CPC ....... G01R 19/00; G01R 19/0092; H02J 7/00; H02J 7/022; H02M 1/00; H02M 1/084;
    (Continued)

(56) References Cited

U.S. PATENT DOCUMENTS 6,919,699 B2   7/2005  Matsubara et al.
8,725,357 B2   5/2014  Imamura et al.
               (Continued)

FOREIGN PATENT DOCUMENTS

JP    04-289781 A     10/1992
JP    2004-072807 A    3/2004
              (Continued)

OTHER PUBLICATIONS

U.S. Non-Final Office Action issued in corresponding parent U.S. Appl. No. 15/585,204, dated Jul. 13, 2017.
(Continued)

*Primary Examiner* — Lincoln D Donovan
*Assistant Examiner* — Dave Mattison
(74) *Attorney, Agent, or Firm* — McDermott Will & Emery LLP

(57) ABSTRACT

A power control circuit according to one embodiment includes an H-bridge circuit formed using a plurality of power transistors. The power transistors are respectively connected to current measurement circuits that measure currents flowing through the power transistors. Each of the power transistors includes a main emitter and a sense emitter through which a current corresponding to a current flowing through the main emitter flows. Each of the current measurement circuits measures a current flowing through each of the power transistors by using a current flowing through the sense emitter included in the power transistor. A control circuit controls the power transistors based on current values respectively measured by the current measurement circuits.

10 Claims, 12 Drawing Sheets

Related U.S. Application Data of application No. 14/856,633, filed on Sep. 17, 2015, now Pat. No. 9,673,813.

(51) Int. Cl.
*H02M 1/084* (2006.01)
*G01R 19/00* (2006.01)
*H02M 1/00* (2006.01)

(58) Field of Classification Search
CPC ..... H02M 2001/00; H02M 2001/0009; H02M 3/00; H02M 3/33523; H02M 7/00; H02M 7/003; H02M 7/537; H02M 7/5387; H03K 17/00; H03K 17/687; Y02B 70/00; Y02B 70/1441
USPC .......................................................... 363/131
See application file for complete search history.

(56) References Cited

U.S. PATENT DOCUMENTS

| | | |
|---|---|---|
| 2009/0039869 A1 | 2/2009 | Williams |
| 2010/0141304 A1 | 6/2010 | Miyazaki |
| 2010/0253396 A1 | 10/2010 | Matamura |
| 2012/0075761 A1 | 3/2012 | Miura et al. |
| 2015/0097599 A1 | 4/2015 | Tomohara |
| 2016/0065087 A1* | 3/2016 | Nagaoka ............ G01R 19/0092 324/139 |
| 2016/0233856 A1* | 8/2016 | Wasekura .......... H03K 17/0828 |

FOREIGN PATENT DOCUMENTS

| | | |
|---|---|---|
| JP | 2008-017611 A | 1/2008 |
| JP | 2011-015597 A | 1/2011 |
| JP | 2011-105155 A | 6/2011 |
| JP | 2013-062913 A | 4/2013 |

OTHER PUBLICATIONS

U.S. Final Office Action issued in corresponding parent U.S. Appl. No. 15/585,204, dated Jan. 26, 2018.
U.S. Non-Final Office Action issued in corresponding parent U.S. Appl. No. 15/585,204, dated Apr. 23, 2019.
U.S. Appl. No. 15/585,204, filed May 3, 2017.
Japanese Communication issued in corresponding Japanese Patent Application No. 2014-190820, dated Apr. 3, 2018, with English Translation.

* cited by examiner

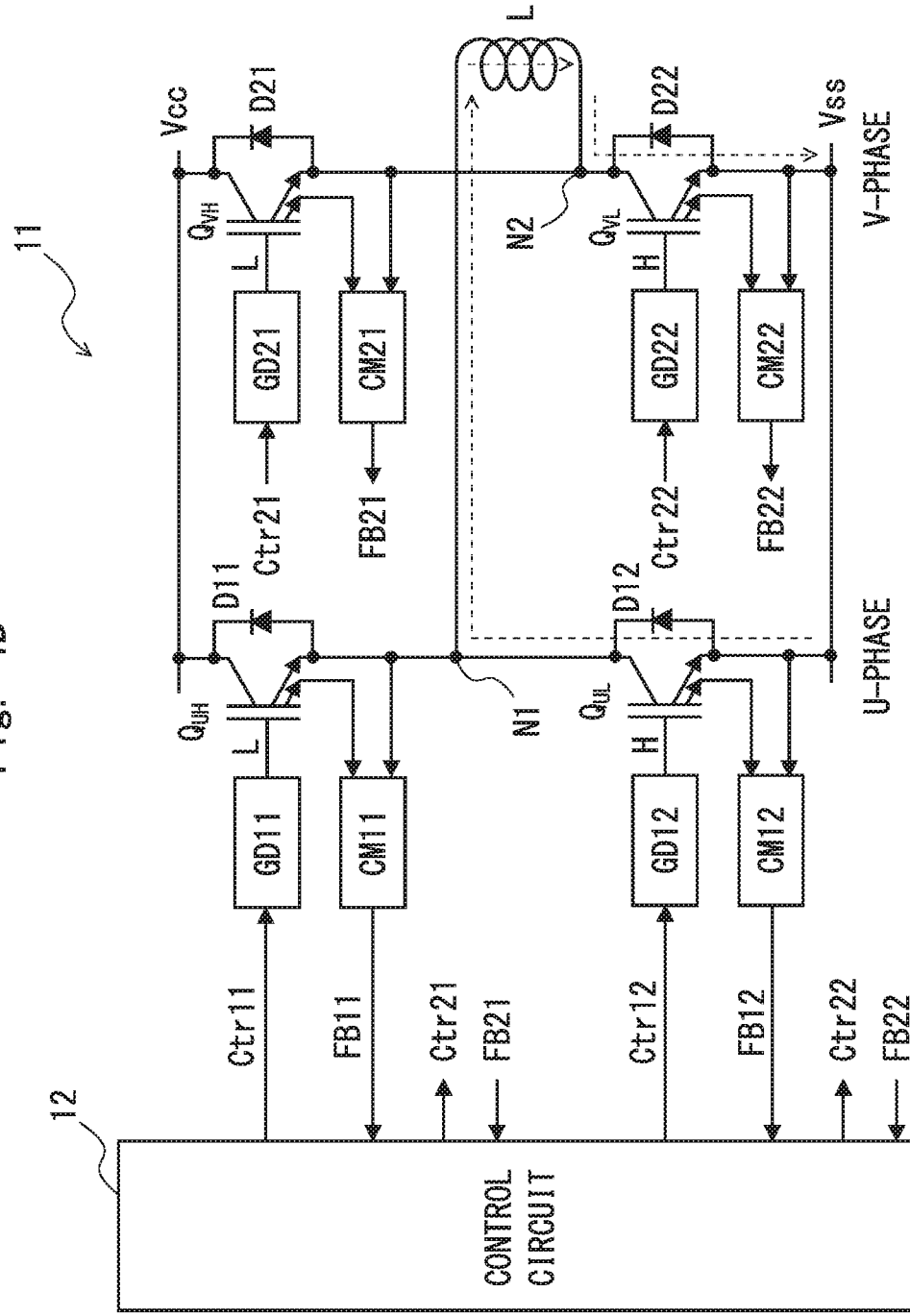

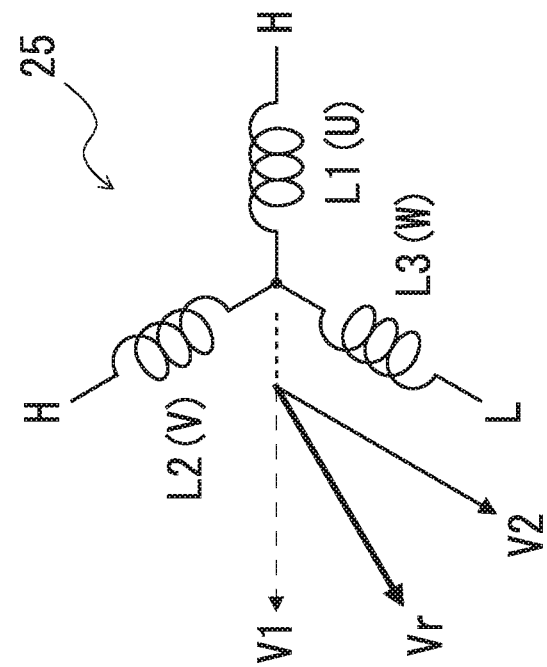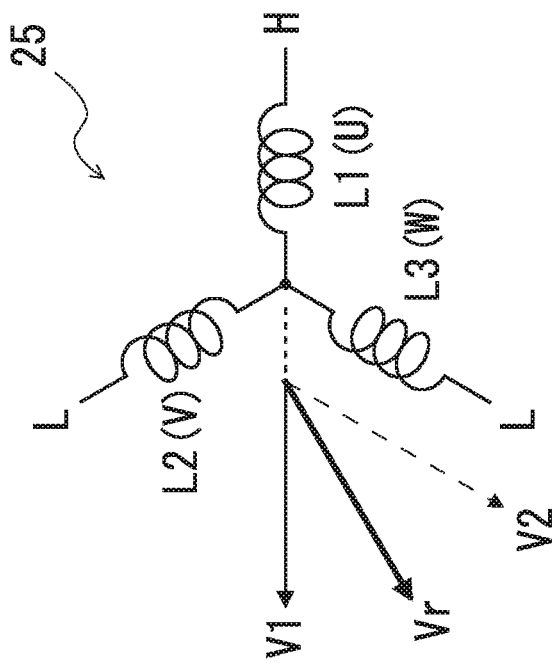
Fig. 8

POWER CONTROL CIRCUIT

CROSS-REFERENCE TO RELATED APPLICATIONS

This is a Continuation of U.S. patent application Ser. No. 15/585,204 filed on May 3, 2017, which is a Continuation of U.S. patent application Ser. No. 14/856,633 filed on Sep. 17, 2015, now U.S. Pat. No. 9,673,813, which is based upon and claims priority from Japanese Patent Application No. 2014-190820, filed on Sep. 19, 2014, the disclosures of each are incorporated by reference herein in their entirety.

BACKGROUND

The present invention relates to a power control circuit and, for example, relates to a power control circuit including a current measurement circuit that measures a current flowing through a power transistor.

A power transistor is widely used today as an element that passes a current through a load requiring a large current. As the power transistor, an element using a bipolar transistor or an element using MOSFET (Metal-Oxide-Semiconductor Field-Effect Transistor) is used, for example. Particularly, IGBT (Insulated Gate Bipolar Transistor) is commonly used.

For example, an inverter circuit, a battery charger or the like using a power transistor measures a current flowing through a load and performs feedback control of the power transistor by using a measured current value. In the case of driving a motor by using an inverter circuit, for example, because a torque generated by the motor is proportional to a current, a current flowing through the motor (coil) is fed back in order to obtain a desired torque. Further, in a battery charger, a current flowing through a battery is fed back in order to prevent a current exceeding a specified value from flowing to the battery.

For the detection of a current, a shunt resistor, a current transformer, a Hall element, a magnetoresistive element and the like are mainly used. In the case of using the shunt resistor, a resistor is inserted into a path through which a load current flows, and voltages at both ends of the resistor are measured. Although current measurement using the shunt resistor can be made with a low cost, because heating due to Joule loss in the resistor occurs, it is used for applications with relatively small current consumption such as electric home appliances.

In applications that pass a relatively large current such as industrial equipment, electric vehicles and hybrid vehicles, a current transformer, a Hall element, a magnetoresistive element and the like are used. The current transformer is a device that includes a primary coil inserted into a path through which a load current flows and a secondary coil magnetically coupled to the primary coil, and reads a voltage generated at the secondary coil. The Hall element is a device that reads a voltage generated by passing a current different from a load current in a magnetic field where a load current is generated. The magnetoresistive element is a device that places an element whose resistance value varies depending on a magnetic field where a load current is generated, and reads a voltage generated when passing a current through the resistor.

Further, the technique that measures a current flowing through a load by using a Hall element and performs feedback control of a current flowing through a load with the measured current value is disclosed in Japanese Unexamined Patent Application Publication No. 2004-72807.

SUMMARY

As described in the above BACKGROUND section, electronic equipment using a power transistor measures a current flowing through a load and performs feedback control of the power transistor by using the measured current value. For example, in applications that pass a relatively large current such as industrial equipment, electric vehicles and hybrid vehicles, a current measurement circuit including a current transformer, a Hall element, a magnetoresistive element or the like is used for such current measurement. However, the current measurement circuit including a current transformer, a Hall element, a magnetoresistive element or the like has a problem that the cost for constructing the current measurement circuit is high.

The other problems and novel features of the present invention will become apparent from the description of the specification and the accompanying drawings.

A power control circuit according to one embodiment includes an H-bridge circuit or a three-phase inverter circuit formed using a plurality of power transistors. Each power transistor includes a current measurement circuit that measures a current flowing through the power transistor. Each power transistor includes a main emitter and a sense emitter through which a current corresponding to a current flowing through the main emitter flows. Each current measurement circuit measures a current flowing through each power transistor by using a current flowing through the sense emitter included in the power transistor. A control circuit obtains a current value flowing through a load circuit by using an output value from each current measurement circuit.

According to the above embodiment, it is possible to provide a power control circuit including a low cost current measurement circuit.

BRIEF DESCRIPTION OF THE DRAWINGS

The above and other aspects, advantages and features will be more apparent from the following description of certain embodiments taken in conjunction with the accompanying drawings, in which:

FIG. 4B is a view illustrating an operation of the power control circuit according to the first embodiment.

FIG. 8 is a view illustrating a resultant vector generated in a load circuit of the power control circuit according to the second embodiment.

DETAILED DESCRIPTION

A power control circuit according to an embodiment is described hereinafter. In a first embodiment, the case where the power control circuit is applied to an H-bridge circuit is described. In a second embodiment, the case where the power control circuit is applied to a three-phase inverter circuit is described.

First Embodiment

Figure 1:
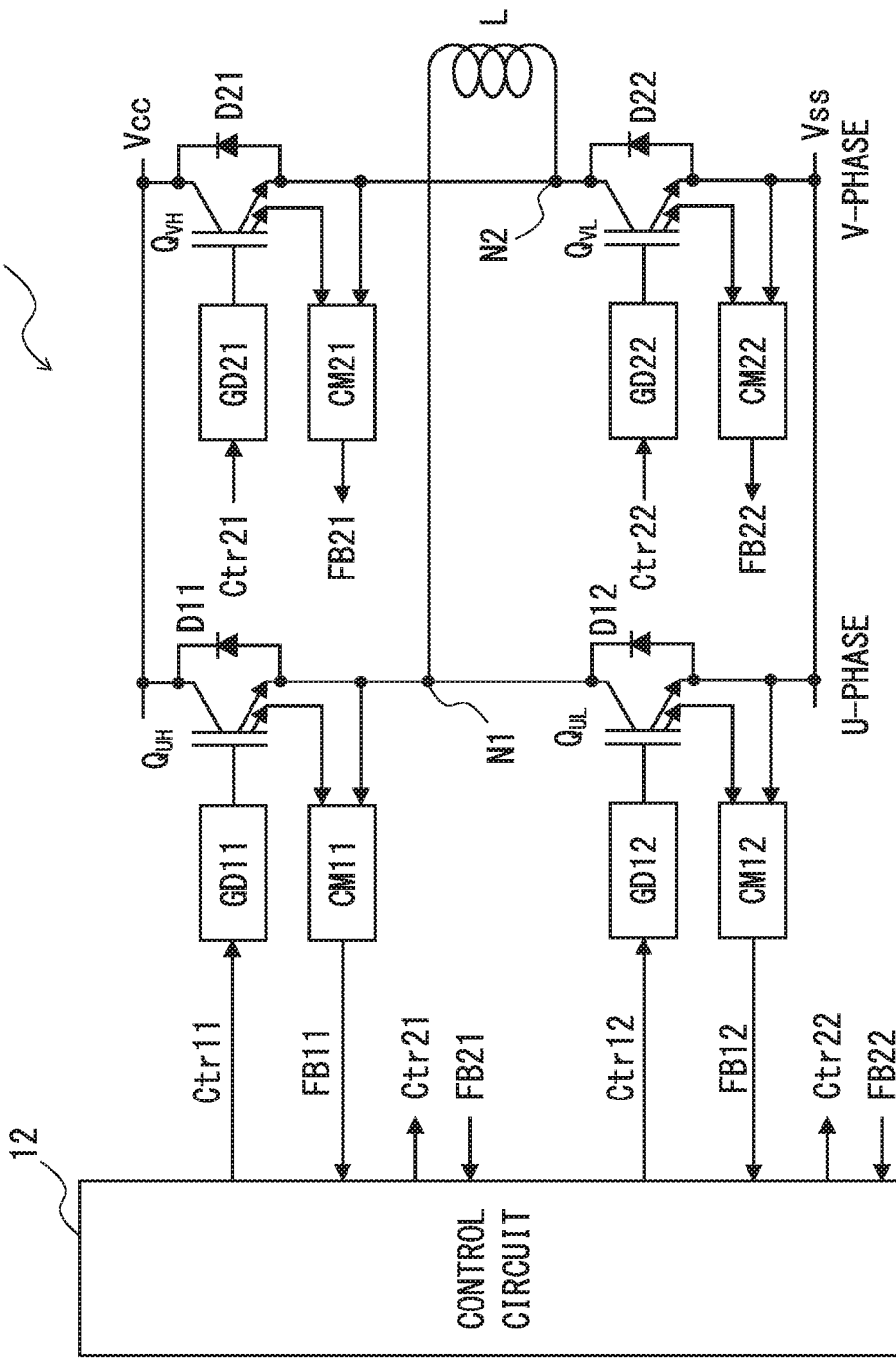
FIG. 1 is a circuit diagram showing a power control circuit according to a first embodiment.

The first embodiment is described hereinafter with reference to the drawings. FIG. 1 is a circuit diagram showing a power control circuit according to this embodiment. As shown in FIG. 1, a power control circuit 1 according to this embodiment includes an H-bridge circuit 11, a control circuit 12, current measurement circuits CM11, CM12, CM21 and CM22, gate drive circuits GD11, GD12, GD21 and GD22, and a load circuit L.

The H-bridge circuit 11 drives the load circuit L that is formed using an inductor. The H-bridge circuit 11 includes power transistors $Q_{UH}$, $Q_{UL}$, $Q_{VH}$ and $Q_{VL}$ and diodes D11, D12, D21 and D22. The collector of the power transistor $Q_{UH}$ (first power transistor) is connected to a high-voltage power supply Vcc and the emitter of the power transistor $Q_{UH}$ is connected to a node N1, forming a U-phase (first-phase) top arm (high side). The collector of the power transistor $Q_{UL}$ (second power transistor) is connected to the node N1, and the emitter of the power transistor $Q_{UL}$ is connected to a low-voltage power supply Vss, forming a U-phase bottom arm (low side). The collector of the power transistor $Q_{VH}$ (third power transistor) is connected to the high-voltage power supply Vcc and the emitter of the power transistor $Q_{VH}$ is connected to a node N2, forming a V-phase (second-phase) top arm. The collector of the power transistor $Q_{VL}$ (fourth power transistor) is connected to the node N2, and the emitter of the power transistor $Q_{VL}$ is connected to the low-voltage power supply Vss, forming a V-phase bottom arm. The first and second terminals of the load circuit L are respectively connected to the nodes (output nodes) N1 and N2.

The diode D11 is in inverse-parallel connection with the power transistor $Q_{UH}$. The diode D12 is in inverse-parallel connection with the power transistor $Q_{UL}$. The diode D21 is in inverse-parallel connection with the power transistor $Q_{VH}$. The diode D22 is in inverse-parallel connection with the power transistor $Q_{VL}$.

The current measurement circuits CM11, CM12, CM21 and CM22 measure currents flowing through the power transistors $Q_{UH}$, $Q_{UL}$, $Q_{VH}$ and $Q_{VL}$, respectively. Current value information FB11, FB12, FB21 and FB22 related to the current values measured by the current measurement circuits CM11, CM12, CM21 and CM22 are respectively supplied to the control circuit 12.

The control circuit 12 controls the gate drive circuits GD11, GD12, GD21 and GD22 based on the current value information FB11, FB12, FB21 and FB22 supplied from the current measurement circuits CM11, CM12, CM21 and CM22, respectively. The control circuit 12 outputs control signals Ctr11, Ctr12, Ctr21 and Ctr22 for controlling the gate drive circuits GD11, GD12, GD21 and GD22 to the gate drive circuits GD11, GD12, GD21 and GD22, respectively.

The gate drive circuits GD11, GD12, GD21 and GD22 are respectively connected to the gates of the power transistors $Q_{UH}$, $Q_{UL}$, $Q_{VH}$ and $Q_{VL}$, and output drive voltages for driving the power transistors $Q_{UH}$, $Q_{UL}$, $Q_{VH}$ and $Q_{VL}$ in accordance with the control signals Ctr11, Ctr12, Ctr21 and Ctr22.

Figure 2:
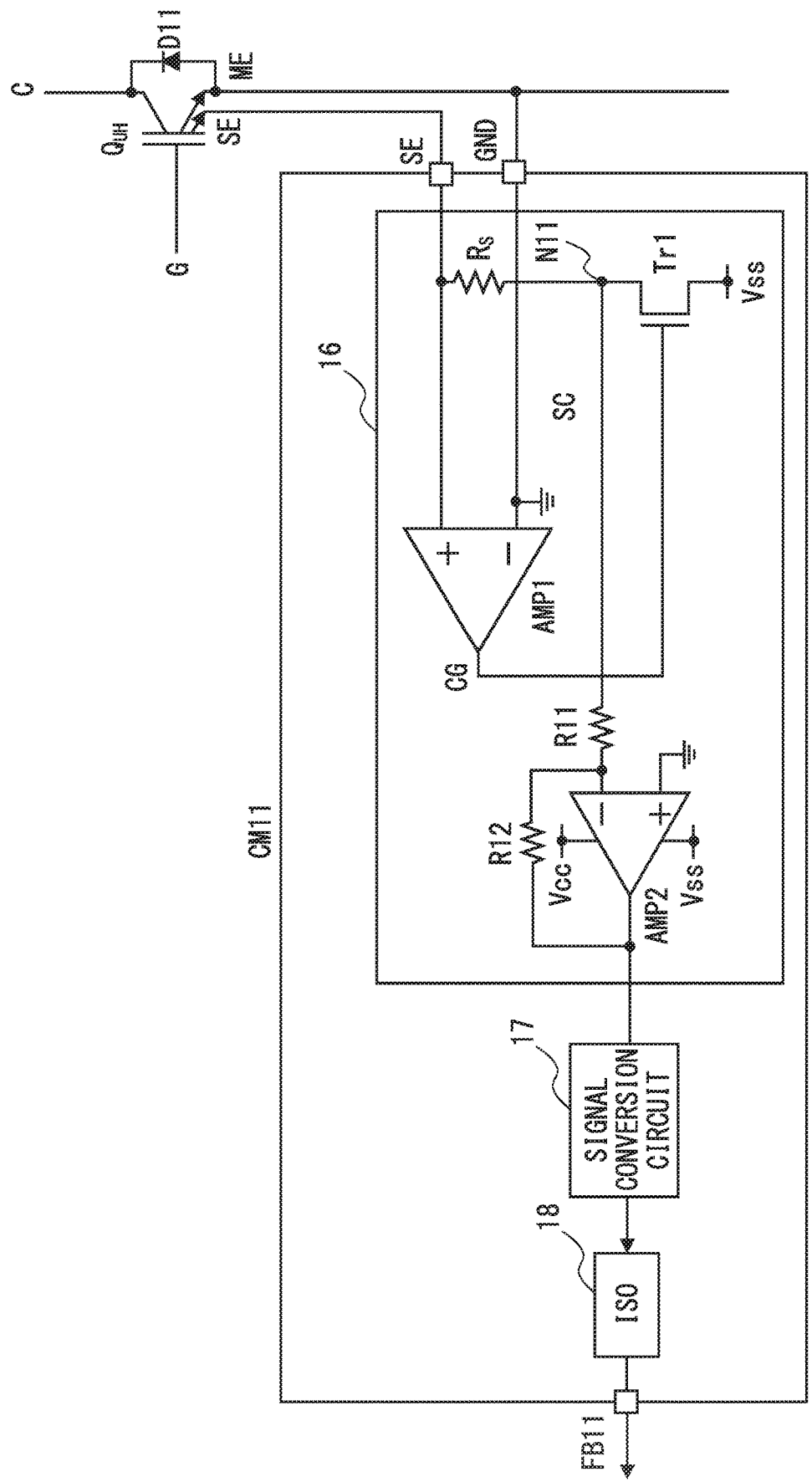
FIG. 2 is a circuit diagram showing a current measurement circuit included in the power control circuit according to the first embodiment.

FIG. 2 is a circuit diagram showing the current measurement circuit CM11 included in the power control circuit 1 according to this embodiment (note that, the same applies to the other current measurement circuits CM12, CM21 and CM22). As shown in FIG. 2, the current measurement circuit CM11 includes a compensation circuit 16, a signal conversion circuit 17, and an isolator 18. The current measurement circuit CM11 measures a current flowing through the emitter of the power transistor $Q_{UH}$. The compensation circuit 16 includes a shunt resistor Rs, an adjustment transistor Tr1, and operational amplifiers AMP1 and AMP2.

The power transistor $Q_{UH}$ includes a main emitter ME and a sense emitter SE through which a current corresponding to a current flowing through the main emitter ME flows. For example, the power transistor $Q_{UH}$ has a configuration in which a plurality of transistor elements are connected in parallel, and the emitters of the plurality of transistor elements are divided into the main emitter E and the sense emitter SE. The current measurement circuit CM11 can estimate a current flowing through the main emitter ME of the power transistor $Q_{UH}$ by measuring a current flowing through the sense emitter SE of the power transistor $Q_{UH}$. The ratio of the number of emitters that form the main emitter ME and the number of emitters that form the sense emitter SE corresponds to a sense ratio. For example, the sense ratio may be approximately 1000:1.

The main emitter ME of the power transistor $Q_{UH}$ is connected to an inverting input terminal (second input terminal) of the operational amplifier AMP1 (operational amplifier) included in the compensation circuit 16. The sense emitter SE of the power transistor $Q_{UH}$ is connected to a non-inverting input terminal (first input terminal) of the operational amplifier AMP1. One end of the shunt resistor Rs (resistor element) is connected to the sense emitter SE, and the other end of the same is connected to a node N11.

The adjustment transistor Tr1 is placed between the node N11 and the low-voltage power supply Vss. Specifically, the collector of the adjustment transistor Tr1 is connected to the node N11, the emitter of the adjustment transistor Tr1 is connected to the power supply Vss, and an output CG of the operational amplifier AMP1 is supplied to the base of the adjustment transistor Tr1. Note that the adjustment transistor Tr1 may be formed using MOSFET. When using MOSFET, the drain of the adjustment transistor Tr1 is connected to the node N11, the source of the adjustment transistor Tr1 is connected to the power supply Vss, and the output CG of the operational amplifier AMP1 is supplied to the gate of the adjustment transistor Tr1. Hereinafter, the case where the adjustment transistor Tr1 is formed using MOSFET is described as one example.

The compensation circuit 16 performs feedback control of the voltage at one end of the shunt resistor Rs (which is the voltage of the sense emitter SE) by using the operational amplifier AMP1 in order to keep the voltage of the sense emitter SE to be substantially the same as the voltage of the main emitter ME. Specifically, the operational amplifier AMP1 adjusts a current flowing through the adjustment transistor Tr1 so that the voltage of the main emitter ME and the voltage of the sense emitter SE are substantially the same.

For example, when the voltage of the sense emitter SE is higher than the voltage of the main emitter ME, the output voltage CG of the operational amplifier AMP1 becomes higher, and the gate voltage of the adjustment transistor Tr1 increases. A current flowing through the adjustment transistor Tr1 thereby increases, and the voltage of the sense emitter SE decreases. On the contrary, when the voltage of the main emitter ME is higher than the voltage of the sense emitter SE, the output voltage CG of the operational amplifier AMP1 becomes lower, and the gate voltage of the adjustment transistor Tr1 decreases. A current flowing through the adjustment transistor Tr1 thereby decreases, and the voltage of the sense emitter SE increases. Then, it balances out when the input voltage of the non-inverting input terminal and the input voltage of the inverting input terminal of the operational amplifier AMP1 (which are the voltage of the sense emitter SE and the voltage of the main emitter ME) become the same.

By placing the operational amplifier AMP1 in this manner, the voltage of the sense emitter SE can be kept substantially the same as the voltage of the main emitter ME, and it is thereby possible to align the bias conditions of the main emitter ME and the sense emitter SE of the power transistor $Q_{UH}$. Accordingly, it is possible to keep the sense ratio of the power transistor $Q_{UH}$ (the ratio of a current flowing through the main emitter ME and a current flowing through the sense emitter SE) constant regardless of the temperature, gate voltage and collector voltage. As a result, a current proportional to a current flowing through the main emitter ME of the power transistor $Q_{UH}$ flows through the sense emitter SE. Thus, due to a voltage drop by the shunt resistor Rs, a voltage proportional to a current flowing through the main emitter ME of the power transistor $Q_{UH}$ occurs at the node N11. When a current flowing through the main emitter ME of the power transistor $Q_{UH}$ is $I_{CE}$, a current flowing through the sense emitter SE is $I_{CSE}$, a sense ratio is $\gamma$, and a voltage of the node N11 is $V_{SC}$, $V_{SC}=-Rs \cdot I_{CSE}=-Rs \cdot \gamma \cdot I_{CE}$. Thus, as a current flowing through the emitter ME of the power transistor $Q_{UH}$ becomes larger, a voltage of the node N11 decreases.

At this time, the configuration is constructed so that the low-voltage power supply Vss of the operational amplifier AMP1 and the low-voltage power supply Vss connected with the source of the adjustment transistor Tr1 are lower than the voltage of the main emitter ME of the power transistor $Q_{UH}$.

Particularly, in this embodiment, it is preferred that the low-voltage power supply Vss of the operational amplifier AMP1 is a negative voltage. Specifically, the inverting input terminal of the operational amplifier AMP1 is connected to a ground potential (GND), and the source of the adjustment transistor Tr1 is connected to a negative potential. In this case, because the non-inverting input terminal of the operational amplifier AMP1 acts as a virtual ground, the voltage of the sense emitter SE converges to the same potential as the voltage of the main emitter ME.

To be specific, although the voltage of the sense emitter SE needs to be kept the same as the voltage of the main emitter ME with a current flowing through the shunt resistor Rs, because the main emitter ME is generally connected to the GND of the gate driver circuit, it is necessary to supply a lower negative voltage than that of the sense emitter SE to the other end (node N11) of the shunt resistor Rs. Therefore, the low-voltage power supply Vss of the operational amplifier AMP1 and the source of the adjustment transistor Tr1 are connected to the negative power supply.

The operational amplifier AMP2 amplifies the voltage of the node N1 and outputs the amplified signal to the signal conversion circuit 17. A current flowing through the sense emitter SE corresponds to the voltage of the node N11.

For example, the inverting input terminal of the operational amplifier AMP2 and the node N11 are connected through a resistor R11, and the non-inverting input terminal of the operational amplifier AMP2 is connected to the ground potential. Further, the output terminal and the inverting input terminal of the operational amplifier AMP2 are connected through a resistor R12. In this configuration, the operational amplifier AMP2 outputs a voltage corresponding to the voltage of the node N11.

The signal conversion circuit 17 converts a signal (analog signal) output from the operational amplifier AMP2 into a digital signal. For example, the signal conversion circuit 17 can be formed using an AD converter, a $\Delta\Sigma$ modulator, a pulse width modulator (PWM) or the like. The isolator 18 is a circuit for electrical insulation and signal level conversion when transmitting a signal. Note that the current measurement circuit CM11 may be incorporated into an IC that forms the gate drive circuit GD11.

In this manner, in the compensation circuit 16 included in the current measurement circuit CM11 shown in FIG. 2, the main emitter ME of the power transistor $Q_{UH}$ is connected to the inverting input terminal of the operational amplifier AMP1, and the sense emitter SE of the power transistor $Q_{UH}$ is connected to the non-inverting input terminal of the operational amplifier AMP1. Further, the adjustment transistor Tr1 is placed between the node N11 and the low-voltage power supply Vss. Then, the output of the operational amplifier AMP1 is supplied to the gate of the adjustment transistor Tr1, and a current flowing through the adjustment transistor Tr1 is adjusted so that the voltage of the main emitter ME and the voltage of the sense emitter SE are substantially the same. It is thereby possible to improve the measurement accuracy of the current measurement circuit CM11.

When a current flowing through the sense emitter SE becomes large, a current flowing through the adjustment transistor Tr1 becomes large, and the heating value of the adjustment transistor Tr1 increases. In view of this, the adjustment transistor Tr1 may be placed outside a semiconductor chip that forms the current measurement circuit CM11 in this embodiment. By placing the adjustment transistor Tr1 outside a semiconductor chip that forms the current measurement circuit CM11, even when the heating value of the adjustment transistor Tr1 increases, it is possible to prevent the heating of the adjustment transistor Tr1 from affecting another circuit.

Figure 3:
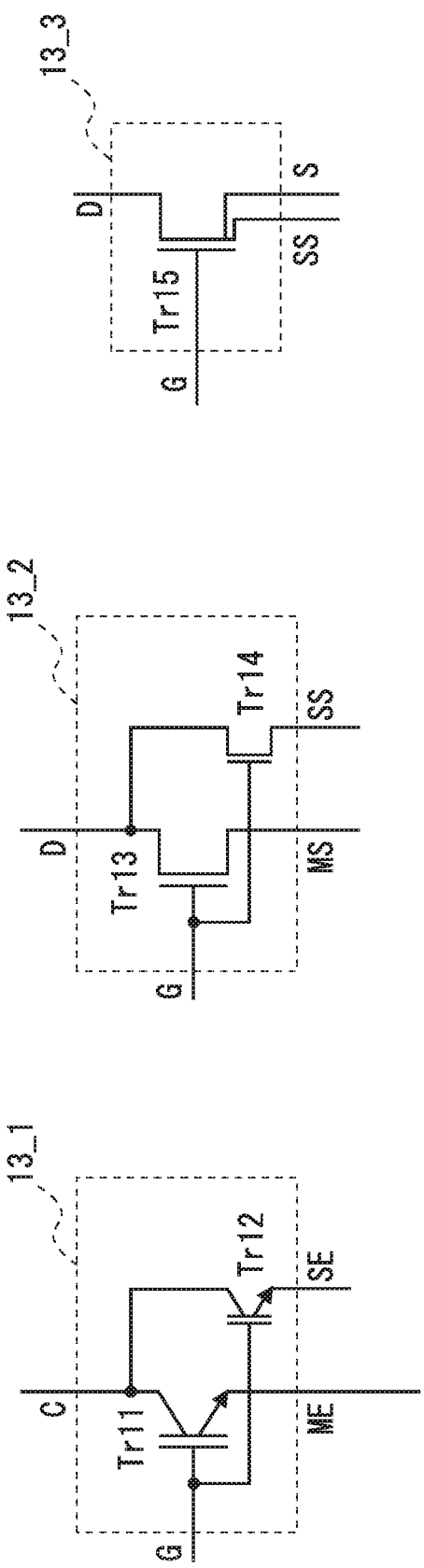
FIG. 3 is a circuit diagram showing another configuration example of a power transistor included in the power control circuit according to the first embodiment.

FIG. 3 is a circuit diagram showing another configuration example of the power transistor. In the power transistors $Q_{UH}$, $Q_{UL}$, $Q_{VH}$ and $Q_{VL}$ shown in FIG. 1, the case of using the power transistor having a configuration in which a plurality of transistor elements are connected in parallel is described. However, in this embodiment, a power transistor 13_1 may be configured using a power transistor Tr11 and a sense transistor Tr12 as shown in the power transistor 13_1 in FIG. 3. Specifically, the power transistor 13_1 includes the power transistor Tr11 and the sense transistor Tr12. The gate of the sense transistor Tr12 is connected to the gate of the power transistor Tr11, and the drain of the sense transistor Tr12 is connected to the drain of the power transistor Tr11. In other words, the sense transistor Tr12 is connected in parallel with the power transistor Tr11. In this case, the emitter of the power transistor Tr11 serves as the main emitter ME, and the emitter of the sense transistor Tr12 serves as the sense emitter SE.

Further, as shown in a power transistor 13_2 in FIG. 3, the power transistor may be formed using MOSFET in this embodiment. Specifically, the power transistor 13_2 includes a power MOSFET (Tr13) and a sense MOSFET (Tr14). The gate of the sense MOSFET (Tr14) is connected to the gate of the power MOSFET (Tr13), and the drain of the sense MOSFET (Tr14) is connected to the drain of the power MOSFET (Tr13). In other words, the sense MOSFET (Tr14) is connected in parallel with the power MOSFET (Tr13). In this case, the source of the power MOSFET (Tr13) serves as a main source MS, and the source of the sense MOSFET (Tr14) serves as a sense source SS.

The power transistor circuit 13_2 has a configuration in which the power MOSFET (Tr13) and the sense MOSFET (Tr14) are formed using different MOSFET as an example. However, in this embodiment, some sources of a plurality of transistor elements that form a power MOSFET (Tr15) may be used as a sense source SS as shown in a power transistor circuit 13_3 in FIG. 3. Specifically, the power MOSFET (Tr15) has a configuration in which a plurality of transistor elements are connected in parallel, and the sources of the plurality of transistor elements may be divided into the main source S and the sense source SS. In this case, the number of sources that form the sense source SS is smaller than the number of sources that form the main source S. The ratio of the number of sources that form the main source S and the number of sources that form the sense source SS corresponds to the sense ratio.

As described above, MOSFET can be used as the transistor in this embodiment. In this specification, each terminal of the transistor is referred to as "base or gate", "collector or drain" or "emitter or source" in some cases.

Figure 4A:
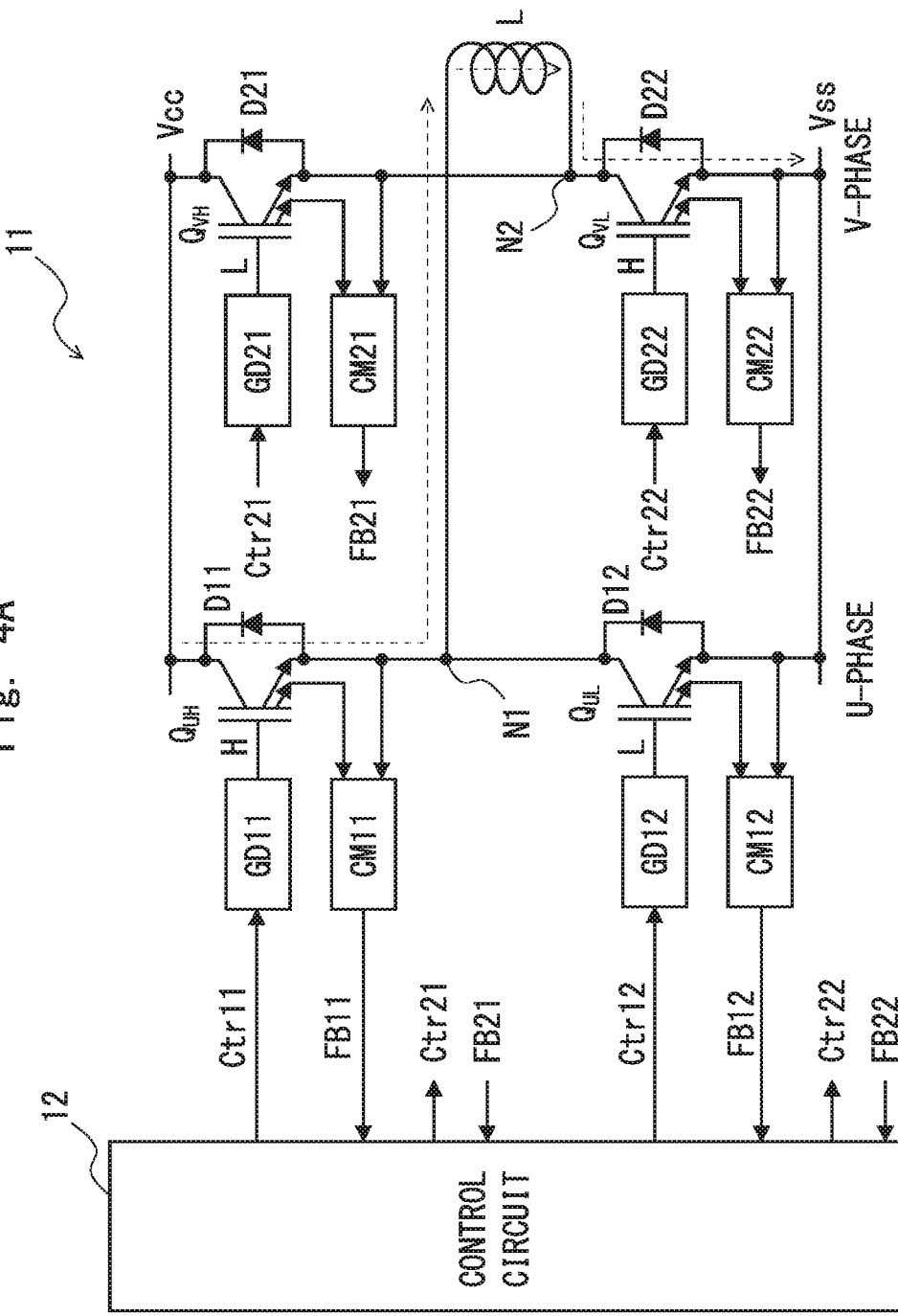
FIG. 4A is a view illustrating an operation of the power control circuit according to the first embodiment.

The operation of the power control circuit 1 according to this embodiment is described hereinafter with reference to FIGS. 4A to 4D. As shown in FIG. 4A, when a high level drive signal is supplied to the gates of the power transistors $Q_{UH}$ and $Q_{VL}$, the power transistors $Q_{UH}$ and $Q_{VL}$ turn ON. Further, when a low level drive signal is supplied to the gates of the power transistors $Q_{UL}$ and $Q_{VH}$, the power transistors $Q_{UL}$ and $Q_{VH}$ turn OFF. At this time, a current flows in the direction from a first terminal (a terminal connected to the node N1, which is also referred to hereinafter as a first terminal N1) of the load circuit L to a second terminal (a terminal connected to the node N2, which is also referred to hereinafter as a second terminal N2) of the load circuit L.

For example, it is assumed that a current of 50 A flows in the direction from the first terminal N1 to the second terminal N2 of the load circuit L. In this case, the current measurement circuits CM11 and CM12 respectively connected to the power transistors $Q_{UH}$ and $Q_{VL}$ can estimate that currents flowing through the main emitters ME are both 50 A by using the currents supplied from the sense emitters SE of the power transistors $Q_{UH}$ and $Q_{VL}$. Measurement results of the current measurement circuits CM11 and CM12 are fed back to the control circuit 12. The control circuit 12 can thereby recognize a current flowing through the load circuit L.

When a current in the direction of flowing into the terminal of the load circuit L is positive, and a current in the direction of flowing out of the terminal of the load circuit L is negative, a current of +50 A flows through the first terminal N1 of the load circuit L, and a current of −50 A flows through the second terminal N2 of the load circuit L.

When a current of 50 A is measured by the current measurement circuit CM11 of the top arm power transistor $Q_{UH}$, a current of +50 A flows through the first terminal N1 of the load circuit L. On the other hand, when a current of 50 A is measured by the current measurement circuit CM22 of the bottom arm power transistor $Q_{VL}$, a current of −50 A flows through the second terminal N2 of the load circuit L. Likewise, when a current of 50 A is measured by the current measurement circuit CM21 of the top arm power transistor $Q_{VH}$, a current of +50 A flows through the second terminal N2 of the load circuit L, and when a current of 50 A is measured by the current measurement circuit CM12 of the bottom arm power transistor $Q_{UL}$, a current of −50 A flows through the first terminal N1 of the load circuit L.

In this manner, the direction of a current flowing through the terminal of the load circuit L is different between the case of measuring a current by using the top arm current measurement circuit CM11, CM21 and the case of measuring a current by using the bottom arm current measurement circuit CM12, CM22. The control circuit 12 can recognize the direction of a current flowing through the load circuit L based on whether it is a current value measured using the top arm current measurement circuit CM11, CM21 or it is a current value measured using the bottom arm current measurement circuit CM12, CM22.

FIG. 4B shows the state immediately after inverting the switching state of U-phase from the state of FIG. 4A. Specifically, a low level drive voltage is supplied to the gates of the power transistors $Q_{UH}$ and $Q_{VH}$ to turn the power transistors $Q_{UH}$ and $Q_{VH}$ OFF, and a high level drive voltage is supplied to the gates of the power transistors $Q_{UL}$ and $Q_{VL}$ to turn the power transistors $Q_{UL}$ and $Q_{VL}$ ON. At this time, because a current flowing through the load circuit L (inductor) cannot change abruptly, a current of 50 A flows in the direction from the first terminal N1 to the second terminal N2 of the load circuit L also in the case shown in FIG. 4B just like the case shown in FIG. 4A.

Because the U-phase power transistor $Q_{UL}$ cannot pass a current in the direction from the emitter to the collector, a current flows through the diode D12 (reflux diode) in inverse-parallel connection with the power transistor $Q_{UL}$. Accordingly, a current that flows through the sense emitter of the power transistor $Q_{UL}$ becomes zero, and the current measurement circuit CM12 connected to the power transistor $Q_{UL}$ cannot measure a current. In this case, a current value that is fed back to the control circuit 12 is only 50 A, which is a current value that is output from the current measurement circuit CM22 connected to the power transistor $Q_{VL}$.

However, currents flowing through the first terminal N1 and the second terminal N2 of the load circuit L are currents having opposite signs and having the same absolute value. Accordingly, the control circuit 12 can estimate a current flowing through the load circuit L if a current flowing through the power transistor $Q_{VL}$ can be measured. Thus, in the H-bridge circuit, if a current value can be measured by any one or more of the current measurement circuits CM11, CM12, CM21 and CM22 respectively connected to the four power transistors $Q_{UH}$, $Q_{UL}$, $Q_{VH}$ and $Q_{VL}$, the control circuit 12 can estimate a current flowing through the load circuit L by appropriately inverting the sign indicating the direction of a current.

Figure 4C:
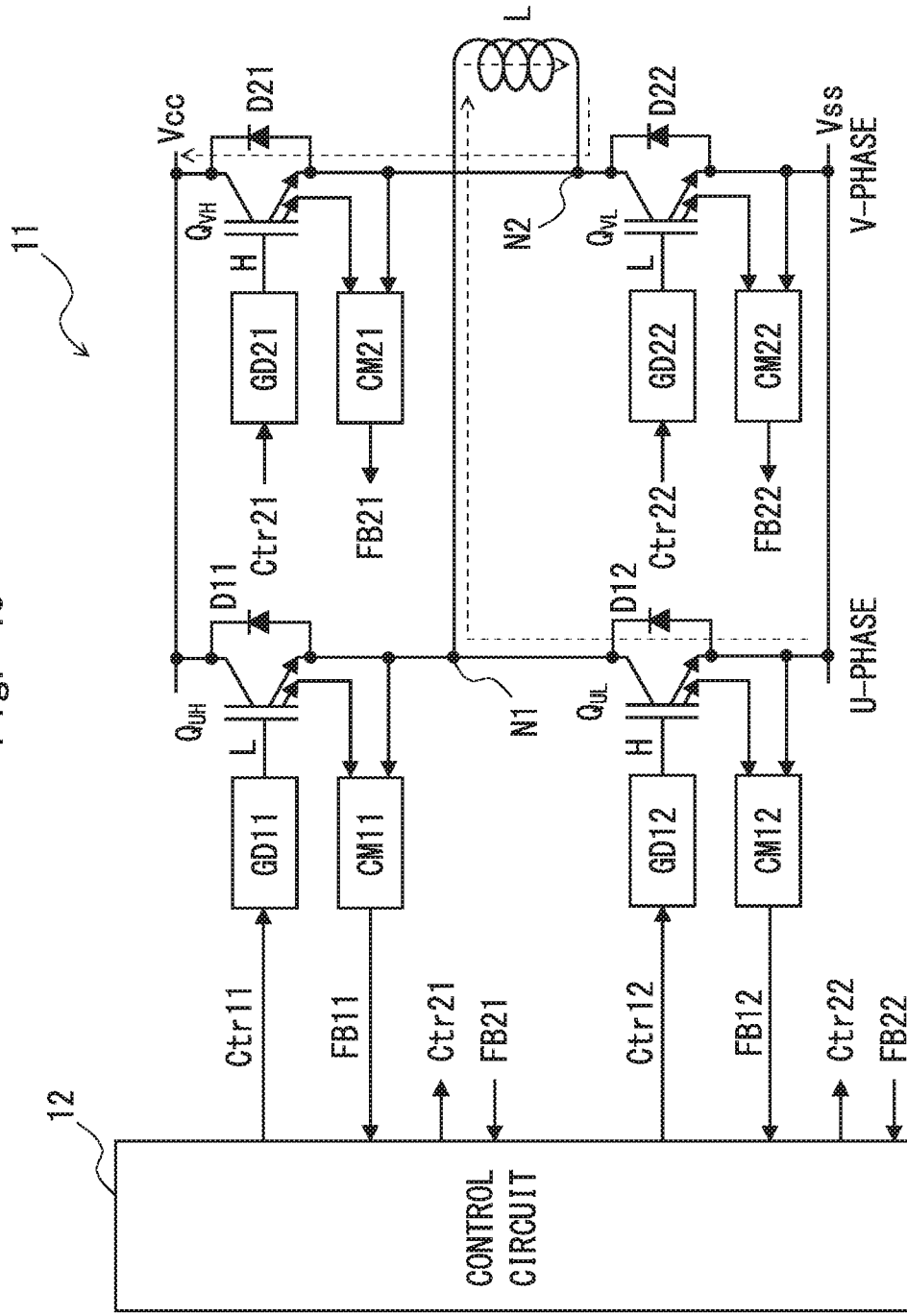
FIG. 4C is a view illustrating an operation of the power control circuit according to the first embodiment.

FIG. 4C shows the state immediately after inverting the switching state of U-phase and V-phase from the state of FIG. 4A. Specifically, a high level drive voltage is supplied to the gates of the power transistors $Q_{UL}$ and $Q_{VH}$ to turn the power transistors $Q_{UL}$ and $Q_{VH}$ ON, and a low level drive voltage is supplied to the gates of the power transistors $Q_{UH}$ and $Q_{VL}$ to turn the power transistors $Q_{UH}$ and $Q_{VL}$ OFF. At this time, because a current flowing through the load circuit L (inductor) cannot change abruptly, a current of 50 A flows in the direction from the first terminal N1 to the second terminal N2 of the load circuit L also in the case shown in FIG. 4C just like the case shown in FIG. 4A.

Because the U-phase power transistor $Q_{UL}$ cannot pass a current in the direction from the emitter to the collector, a current flows through the diode D12 in inverse-parallel connection with the power transistor $Q_{UL}$. Likewise, because the V-phase power transistor $Q_{VH}$ cannot pass a current in the direction from the emitter to the collector, a current flows through the diode D21 in inverse-parallel connection with the power transistor $Q_{VH}$. Accordingly, currents that flow through the sense emitters of all the power transistors become zero, and all of the current measurement circuit cannot measure any current.

In this case, the control circuit 12 estimates a current value flowing through the load circuit L by calculation. Specifically, the relationship between a current flowing through an inductor and an applied voltage can be represented by $V(t)=L \cdot dI(t)/dt$ where an inductance of the inductor is L, a voltage applied between terminals is V(t), a current flowing through the inductor is I(t), and an initial value of a current is $I_0$.

Integration of this equation results in $I(t)=1/L \cdot \int V(t) \cdot dt + I_0$. Specifically, if the inductance value L, the voltage waveform V(t) applied to the load circuit L and the initial value $I_0$ of the current are known, the present current value I(t) can be estimated by calculation. The current initial value $I_0$ is determined if it has gone through the state as shown in FIG. 4A or 4B in the past. As for the voltage waveform V(t), a rectangular voltage waveform can be estimated from a difference between the first voltage Vcc and the second voltage Vss and the past history of ON/OFF of the four power transistors $Q_{UH}$, $Q_{UL}$, $Q_{VH}$ and $Q_{VL}$. The value of the inductance L is prestored in the control circuit. It is thereby possible to estimate the present current I(t) by adding $1/L \cdot \int V(t)$, starting from the current value $I_0$ measured in the state of FIG. 4A or 4B.

Figure 4D:
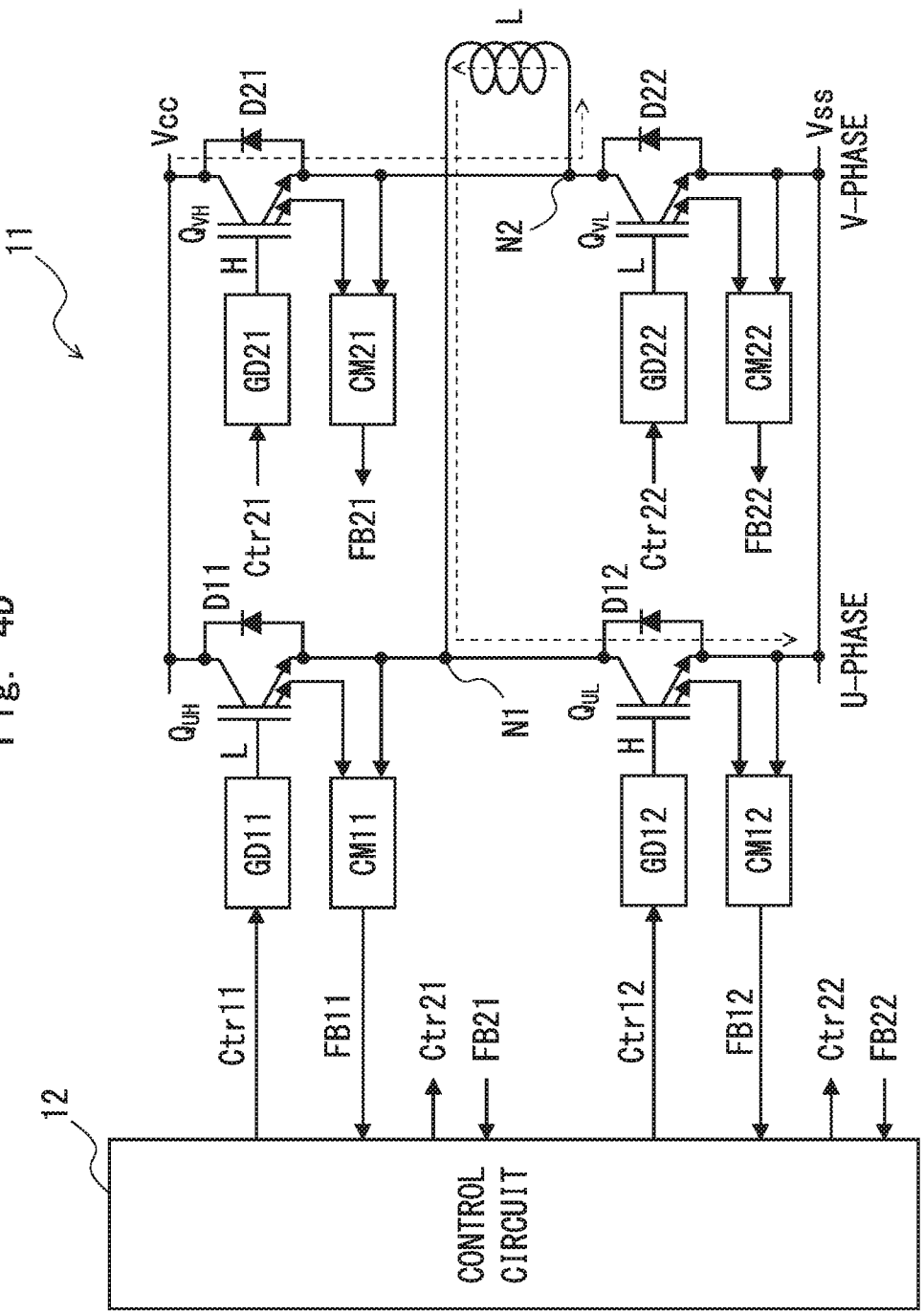
FIG. 4D is a view illustrating an operation of the power control circuit according to the first embodiment.

FIG. 4D shows the state where the direction of a current flowing through the load circuit L is opposite from the direction in the case shown in FIG. 4A. Specifically, in the case shown in FIG. 4D, a high level drive voltage is supplied to the gates of the power transistors $Q_{UL}$ and $Q_{VH}$ to turn the power transistors $Q_{UL}$ and $Q_{VH}$ ON, and a low level drive voltage is supplied to the gates of the power transistors $Q_{UH}$ and $Q_{VL}$ to turn the power transistors $Q_{UH}$ and $Q_{VL}$ OFF.

In this case, a current of 50 A flows from the second terminal N2 to the first terminal N1 of the load circuit L (which is opposite to that in FIG. 4A). While a current flowing through the U-phase top arm power transistor $Q_{UH}$ is measured in the case shown in FIG. 4A, a current flowing through the U-phase bottom arm power transistor $Q_{UL}$ is measured in the case shown in FIG. 4D, thereby estimating a current flowing through the load circuit L. Further, while a current flowing through the V-phase bottom arm power transistor $Q_{VL}$ is measured in the case shown in FIG. 4A, a current flowing through the V-phase top arm power transistor $Q_{VH}$ is measured in the case shown in FIG. 4D, thereby estimating a current flowing through the load circuit L. In the case shown in FIG. 4A, Note that, when the current measurement circuit that measures a current is inverted on the top and bottom arms, the direction of a current flowing through the load circuit L is also reversed. By specifying the current measurement circuit that has measured a current, the control circuit 12 can recognize the direction of a current flowing through the load circuit L. To be specific, when a current is detected by the current measurement circuit CM11 and the current measurement circuit CM22, the control circuit 12 can determine that a current flows from the first terminal N1 to the second terminal N2 of the load circuit L (see FIG. 4A). Further, when a current is detected by the current measurement circuit CM12 and the current measurement circuit CM21, the control circuit 12 can determine that a current flows from the second terminal N2 to the first terminal N1 of the load circuit L.

As described above, in the H-bridge circuit 11, the control circuit 12 can determine the maximum value of the output values from the current measurement circuits CM11, CM12, CM21 and CM22 as a current value flowing through the load circuit L. Further, when currents flowing through the sense emitters of all of the power transistors become zero, and no current is detected by all of the current measurement circuits (see FIG. 4C), the control circuit 12 estimates a current flowing through the load circuit L by calculation. In this case, the current I(t) flowing through the inductor is $I(t)=1/L \cdot \int V(t) \cdot dt + I_0$.

Further, the control circuit 12 controls at least one of a pulse width, a duty ratio and a pulse density of drive voltages to be supplied to the power transistors $Q_{UH}$, $Q_{UL}$, $Q_{VH}$ and $Q_{VL}$ in accordance with the current values respectively measured by the current measurement circuits CM11, CM12, CM21 and CM22.

For example, when the maximum value of the current values respectively measured by the current measurement circuits CM11, CM12, CM21 and CM22 is smaller than a current command value (control target value), the control circuit 12 may extend the period where the power transistors $Q_{UH}$ and $Q_{VH}$ are ON and reduce the period where the power transistors $Q_{UL}$ and $Q_{VL}$ are ON to thereby increase the amount of current to be supplied to the load circuit L. On the other hand, when the maximum value of the current values respectively measured by the current measurement circuits CM11, CM12, CM21 and CM22 is larger than a current command value (control target value), the control circuit 12 may reduce the period where the power transistors $Q_{UH}$ and $Q_{VH}$ are ON and extend the period where the power transistors $Q_{UL}$ and $Q_{VL}$ are ON to thereby decrease the amount of current to be supplied to the load circuit L.

As described in the above BACKGROUND section, electronic equipment using a power transistor measures a current flowing through a load and performs feedback control of the power transistor by using the measured current value. For example, in applications that pass a relatively large current such as industrial equipment, electric vehicles and hybrid vehicles, a current measurement circuit including a current transformer, a Hall element, a magnetoresistive element or the like is used for such current measurement. However, the current measurement circuit including a current transformer, a Hall element, a magnetoresistive element or the like has a problem that the cost for constructing the current measurement circuit is high.

In view of the above, in the power control circuit according to this embodiment, the power transistors $Q_{UH}$, $Q_{UL}$, $Q_{VH}$ and $Q_{VL}$ that constitute the H-bridge circuit 11 are respectively provided with the current measurement circuits CM11, CM12, CM21 and CM22 for measuring currents flowing through the power transistors. Each of the power transistors $Q_{UH}$, $Q_{UL}$, $Q_{VH}$ and $Q_{VL}$ includes the main emitter and the sense emitter through which a current corresponding to a current flowing through the main emitter flows. Each of the current measurement circuits CM11, CM12, CM21 and CM22 measures a current flowing through the corresponding power transistor by using a current flowing through the sense emitter included in each power transistor. Then, the control circuit 12 calculates a current value flowing through the load circuit L by using the output values from the current measurement circuits CM11, CM12, CM21 and CM22.

Even when any of the current measurement circuits CM11, CM12, CM21 and CM22 cannot measure a current value, the control circuit 12 can estimate a current value flowing through the load circuit L by calculation. Specifically, although there is a case where a current flowing through the load circuit L cannot be measured only by placing a current measurement circuit in a power transistor, by performing calculation in the control circuit 12 as described in this embodiment, it is possible to estimate a current value flowing through the load circuit L (each phrase) even when there is a current measurement circuit that cannot measure a current value.

As described above, because the power control circuit according to this embodiment can obtain a current flowing through the load circuit L by using the current measurement circuits CM11, CM12, CM21 and CM22 respectively included in the power transistors $Q_{UH}$, $Q_{UL}$, $Q_{VH}$ and $Q_{VL}$, there is no need to use a current measurement circuit that uses an expensive current transformer, Hall element, magnetoresistive element and the like. It is thereby possible to reduce the cost for constructing the current measurement circuits.

Further, in the power control circuit according to this embodiment, the compensation circuit 16 may be included in each of the current measurement circuits. Because the compensation circuit 16 can keep the voltage of the sense emitter SE to be substantially the same as the voltage of the main emitter ME, it is possible to align the bias conditions of the main emitter ME and the sense emitter SE of the power transistor. Accordingly, it is possible to keep the sense ratio of the power transistor $Q_{UH}$ (the ratio of a current flowing through the main emitter ME and a current flowing through the sense emitter SE) constant regardless of the temperature, gate voltage and collector voltage. It is thereby possible to improve the accuracy of the current measurement circuit.

According to one embodiment described above, it is possible to provide a power control circuit including a low cost current measurement circuit.

Second Embodiment

Figure 5:
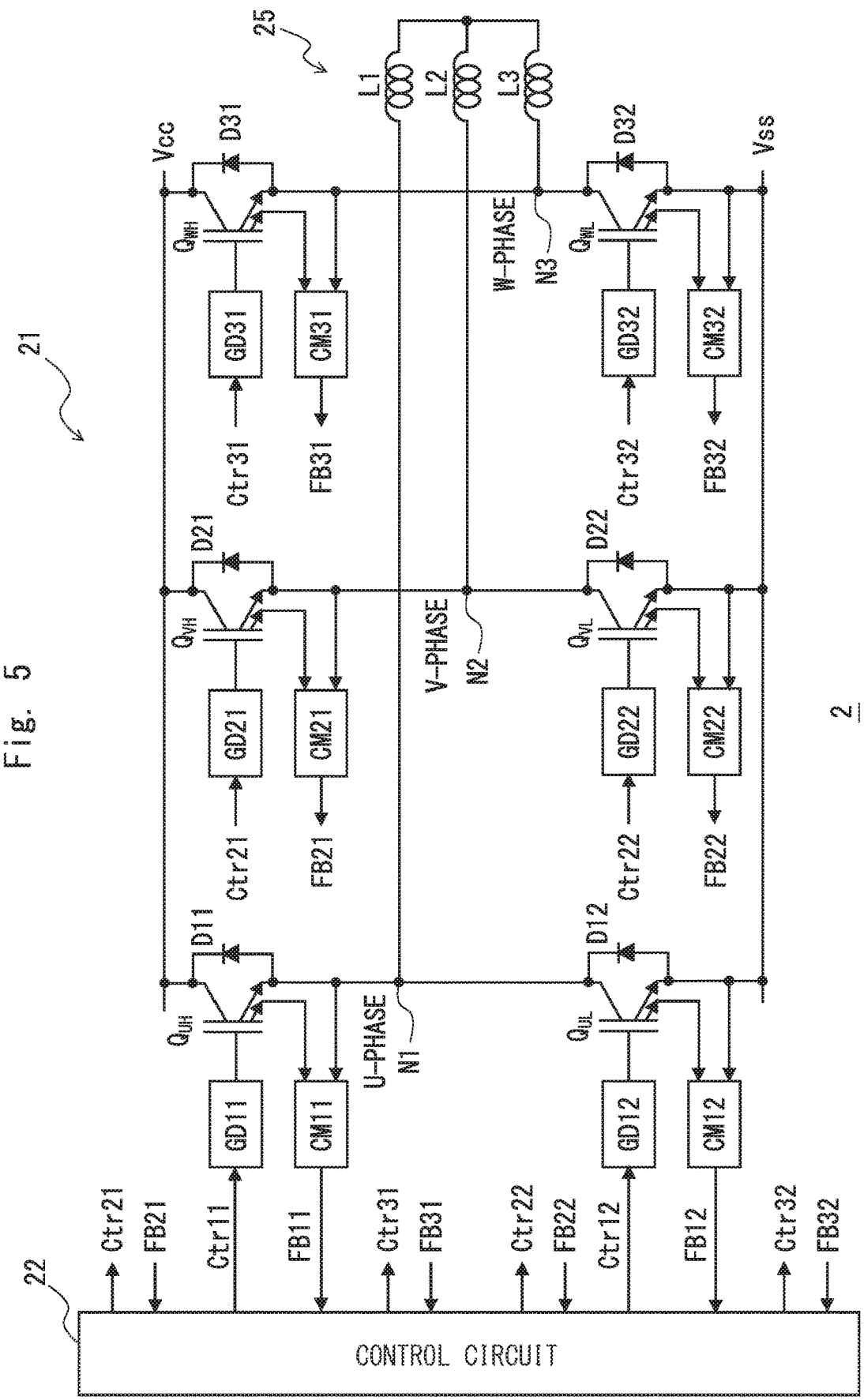
FIG. 5 is a circuit diagram showing a power control circuit according to a second embodiment.

The second embodiment is described hereinafter. In the second embodiment, the case where the power control circuit is applied to a three-phase inverter circuit is described. FIG. 5 is a circuit diagram showing a power control circuit according to this embodiment. As shown in FIG. 5, a power control circuit 2 according to this embodiment includes a three-phase inverter circuit 21, a control circuit 22, current measurement circuits CM11, CM12, CM21 CM22, CM31 and CM32, gate drive circuits GD11, GD12, GD21, GD22, GD31 and GD32, and a load circuit 25.

The three-phase inverter circuit 21 drives the load circuit 25 composed of three inductors L1 to L3. The three-phase inverter circuit 21 includes power transistors $Q_{UH}$, $Q_{UL}$, $Q_{VH}$, $Q_{VL}$, $Q_{WH}$ and $Q_{WL}$ and diodes D11, D12, D21, D22, D31 and D32. The collector of the power transistor $Q_{UH}$ (first power transistor) is connected to a high-voltage power supply Vcc and the emitter of the power transistor $Q_{UH}$ is connected to a node N1, forming a U-phase (first-phase) top arm (high side). The collector of the power transistor $Q_{UL}$ (second power transistor) is connected to the node N1, and the emitter of the power transistor $Q_{UL}$ is connected to a low-voltage power supply Vss, forming a U-phase bottom arm (low side). The collector of the power transistor $Q_{VH}$ (third power transistor) is connected to the high-voltage power supply Vcc and the emitter of the power transistor $Q_{VH}$ is connected to a node N2, forming a V-phase (second-phase) top arm. The collector of the power transistor $Q_{VL}$ (fourth power transistor) is connected to the node N2, and the emitter of the power transistor $Q_{VL}$ is connected to the low-voltage power supply Vss, forming a V-phase bottom arm. The collector of the power transistor $Q_{WH}$ (fifth power transistor) is connected to the high-voltage power supply Vcc and the emitter of the power transistor $Q_{WH}$ is connected to a node N3, forming a W-phase (third-phase) top arm. The collector of the power transistor $Q_{WL}$ (sixth power transistor) is connected to the node N3, and the emitter of the power transistor $Q_{WL}$ is connected to the low-voltage power supply Vss, forming a W-phase bottom arm.

One ends of the inductors L1 to L3 that form the load circuit 25 are respectively connected to the nodes (output nodes) N1 to N3, and the other ends of the inductors L1 to L3 are connected with one another. Hereinafter, the terminal to which one end of the inductor L1 is connected is referred to as the first terminal N1, the terminal to which one end of the inductor L2 is connected is referred to as the second terminal N2, and the terminal to which one end of the inductor L3 is connected is referred to as the third terminal N3 in some cases.

The diode D11 is in inverse-parallel connection with the power transistor $Q_{UH}$. The diode D12 is in inverse-parallel connection with the power transistor $Q_{UL}$. The diode D21 is in inverse-parallel connection with the power transistor $Q_{VH}$. The diode D22 is in inverse-parallel connection with the power transistor $Q_{VL}$. The diode D31 is in inverse-parallel connection with the power transistor $Q_{WH}$. The diode D32 is in inverse-parallel connection with the power transistor $Q_{WL}$.

The current measurement circuits CM11, CM12, CM21 CM22, CM31 and CM32 measure currents flowing through the power transistors $Q_{UH}$, $Q_{UL}$, $Q_{VH}$, $Q_{VL}$, $Q_{WH}$ and $Q_{WL}$, respectively. Current value information FB11, FB12, FB21, FB22, FB31 and FB32 related to the current values measured by the current measurement circuits CM11, CM12, CM21 CM22, CM31 and CM32 are respectively supplied to the control circuit 22.

The control circuit 22 controls the gate drive circuits GD11, GD12, GD21, GD22, GD31 and GD32 based on the current value information FB11, FB12, FB21, FB22, FB31 and FB32 supplied from the current measurement circuits CM11, CM12, CM21 CM22, CM31 and CM32, respectively. The control circuit 22 outputs control signals Ctr11, Ctr12, Ctr21, Ctr22, Ctr31 and Ctr32 for controlling the gate drive circuits GD11, GD12, GD21, GD22, GD31 and GD32 to the gate drive circuits GD11, GD12, GD21, GD22, GD31 and GD32, respectively.

The gate drive circuits GD11, GD12, GD21, GD22, GD31 and GD32 are respectively connected to the gates of the power transistors $Q_{UH}$, $Q_{UL}$, $Q_{VH}$, $Q_{VL}$, $Q_{WH}$ and $Q_{WL}$, and output drive voltages for driving the power transistors $Q_{UH}$, $Q_{UL}$, $Q_{VH}$, $Q_{VL}$, $Q_{WH}$ and $Q_{WL}$ in accordance with the control signals Ctr11, Ctr12, Ctr21, Ctr22, Ctr31 and Ctr32.

Note that the configurations of the current measurement circuits CM11, CM12, CM21 CM22, CM31 and CM32 are the same as that of the current measurement circuit CM11 shown in FIG. 2 and not redundantly described. Further, in this embodiment also, each power transistor may have the configuration shown in FIG. 3.

Figure 6:
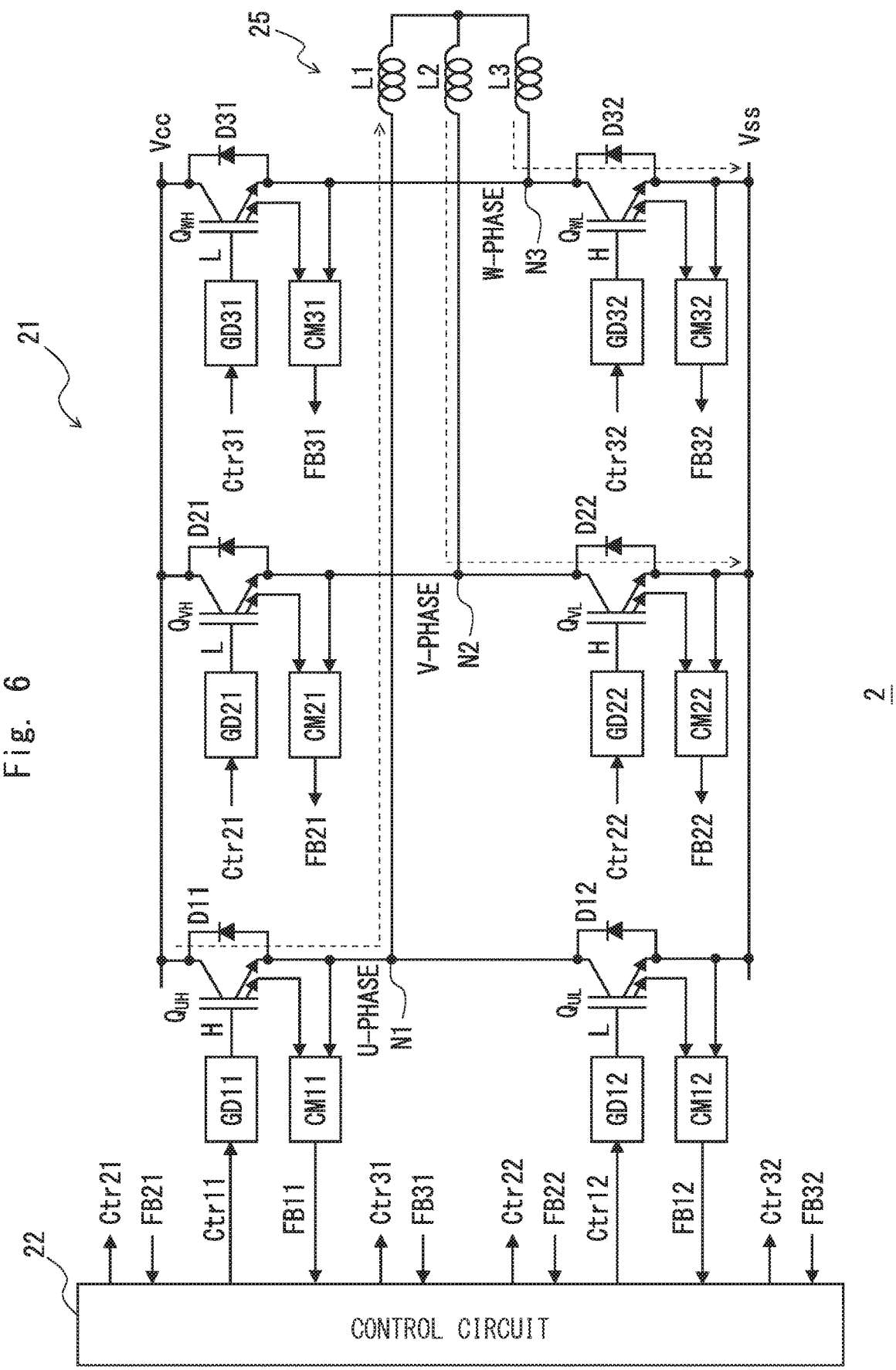
FIG. 6 is a view illustrating an operation of the power control circuit according to the second embodiment.

The operation of the power control circuit 2 according to this embodiment is described hereinafter. As shown in FIG. 6, when a high level drive signal is supplied to the gates of the power transistors $Q_{UH}$, $Q_{VL}$ and $Q_{WL}$, the power transistors $Q_{UH}$, $Q_{VL}$ and $Q_{WL}$ turn ON. Further, when a low level drive signal is supplied to the gates of the power transistors $Q_{UL}$, $Q_{VH}$ and $Q_{WH}$, the power transistors $Q_{UL}$, $Q_{VH}$ and $Q_{WH}$ turn OFF. At this time, a current flows in the direction from the first terminal N1 to the second terminal N2 and the third terminal N3 of the load circuit 25.

For example, it is assumed that a current of 50 A flows into the first terminal N1 of the load circuit 25, and a current of 40 A and a current of 10 A flow out from the second terminal N2 and the third terminal N3 of the load circuit 25, respectively. In this case, the current measurement circuits CM11, CM12 and CM32 respectively connected to the power transistors $Q_{UH}$, $Q_{VL}$ and $Q_{WL}$ can estimate that currents flowing through the main emitters are 50 A, 40 A and 10 A, respectively, by using the currents supplied from the sense emitters of the power transistors $Q_{UH}$, $Q_{VL}$ and $Q_{WL}$. Measurement results of the current measurement circuits CM11, CM12 and CM32 are fed back to the control circuit 22. The control circuit 22 can thereby recognize the currents flowing through the first to third terminals N1 to N3 of the load circuit 25. The sum of the currents flowing through the first to third terminals N1 to N3 of the load circuit 25 is zero based on the Kirchhoff's law.

Figure 7:
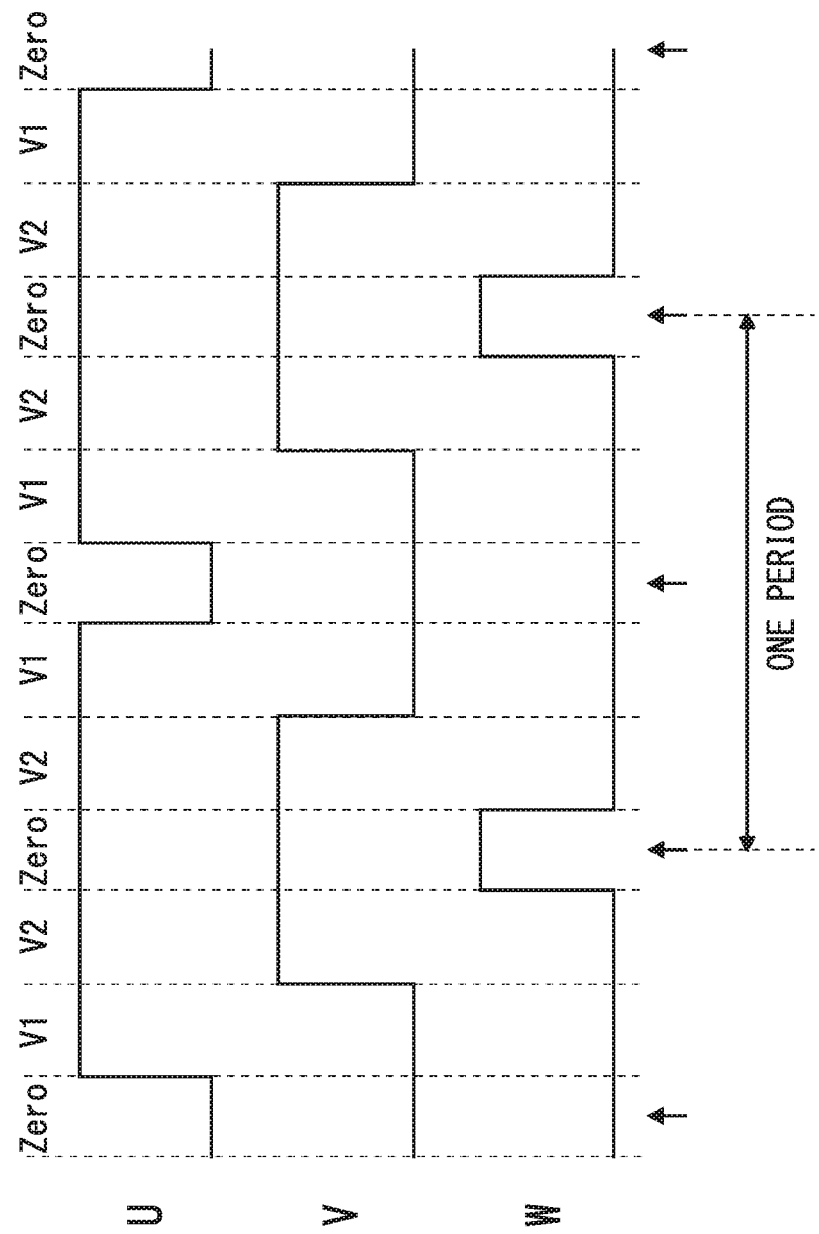
FIG. 7 is a timing chart showing a drive signal of the power control circuit according to the second embodiment.

FIG. 7 is a timing chart showing a drive signal of the power control circuit 2 according to this embodiment, which shows a voltage waveform applied to the load circuit 25 of the three-phase inverter circuit. FIG. 8 is a view illustrating a resultant vector generated in the load circuit 25. For example, considering the direction of the magnetic field produced by the three inductors L1 to L3 connected to one another as shown in FIG. 8, a voltage vector of 60° each can be formed by a combination of voltages to be applied to the U-phase (first terminal N1), the V-phase (second terminal N2) and the W-phase (third terminal N3). Specifically, the voltage can be applied in $2^3=8$ different ways, and because voltages of all terminals are equal in two ways (000 and 111) among them, there are six different combinations where a potential difference occurs among the terminals of the load circuit 25. Accordingly, 360°/6=60°.

In the case of generating a desired current vector Vr, it is possible to control the magnetic field in an arbitrary direction by generating two kinds of voltage vectors alternately to each other with use of the characteristics that a current flowing through an inductor does not change abruptly (that is, the current is proportional to the integration of an applied voltage). Specifically, in the case of generating a vector Vr in the direction of 210° that goes from the first quadrant to the third quadrant as shown in FIG. 8, a vector V1 in the direction of 180° that is generated by setting the U-phase to High (H) level and the V-phase and the W-phase to Low (L) level and a vector V2 in the direction of 240° that is generated by setting the U-phase and the V-phase to High (H) level and the W-phase to Low (L) level are generated alternately to each other.

Further, in the case of controlling the absolute value of a current, the rate of inserting the zero vector is adjusted. The zero vector is the condition where the voltages of all terminals of the U-phase, the V-phase and the W-phase are the same and, to be specific, it is the case where the voltages of all terminals of the U-phase, the V-phase and the W-phase are High level or Low level.

Thus, as the voltage waveform to be applied for controlling the vector Vr of the magnetic field of the load circuit 25 in the direction of 210° as shown in FIG. 8, the vector V1 that sets the U-phase to High level and the V-phase and the W-phase to Low level, the vector V2 that sets the U-phase and the V-phase to High level and the W-phase to Low level, and two types of zero vectors (Zero) are generated in an alternate manner as shown in the timing chart of FIG. 7. It is preferred to control the order of switching and the order of vectors to be generated so that two or more phases of the U-phase, the V-phase and the W-phase do not make switching at the same time. This is for the purpose of preventing an unwanted vector from being generated due to a glitch at the moment of switching that can occur when two or more phrases make switching at the same time.

In this case, measurement of a current is performed at the middle of the zero vector period (which is indicated by the arrow of FIG. 7). This is because, during the zero vector, a difference between voltages applied to the load circuit is zero, and a change in the current flowing through the load circuit is relatively moderate. Further, the average value of currents is reflected most at the center of the zero vector, and further the effect of unstable behavior at the time of switching or immediately after switching is likely to be less significant at the center of the zero vector.

Figure 9:
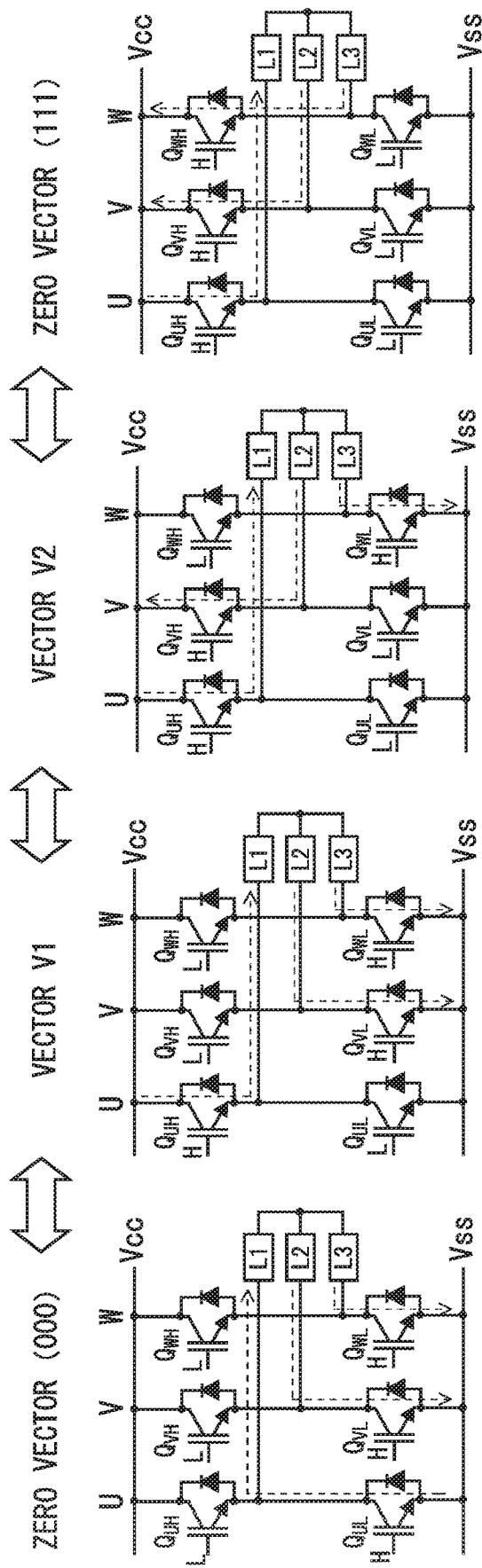
FIG. 9 is a view illustrating an operation of the power control circuit according to the second embodiment.

FIG. 9 is a view illustrating the case of driving the power control circuit 2 by using the drive signal shown in FIG. 7. FIG. 9 shows the directions of currents flowing through the power transistors $Q_{UH}$, $Q_{UL}$, $Q_{VH}$, $Q_{VL}$, $Q_{WH}$ and $Q_{WL}$ and the diodes D11, D12, D21, D22, D31 and D32 when the vector V1, the vector V2 and the zero vectors are applied sequentially.

For example, as described with reference to FIG. 6, when a current flows from the U-phase (first terminal N1) to the V-phase (second terminal N2) and the W-phase (third terminal N3) (initial state), the current can be measured by the current measurement circuits CM11, CM12 and CM32 of the three power transistors $Q_{UH}$, $Q_{VL}$ and $Q_{WL}$ during the period when the voltage of the vector V2 (where the U-phase is High level, the V-phase and the W-phase are Low level) is applied.

In the vector V2 where the switching state of one phase has changed from the state of the vector V1, currents can be measured by the current measurement circuits CM11 and CM32 of the two power transistors $Q_{UH}$ and $Q_{WL}$. Further, in the zero vector (000) (where all the phases are Low level) where the switching state of one phase has changed from the state of the vector V1, currents can be measured by the current measurement circuits CM22 and CM32 of the two power transistors $Q_{VL}$ and $Q_{WL}$. Because the sum of currents flowing through the U-phase, the V-phase and the W-phase is zero based on the Kirchhoff's law, if currents of two phases can be measured, a current of the remaining one phase can be obtained by calculation. This calculation can be performed in the control circuit 22 that includes a microcontroller. Note that a current of the U-phase is a current flowing through the node N1, a current of the V-phase is a current flowing through the node N2, and a current of the W-phase is a current flowing through the node N3.

In the example shown in FIG. 9, when a current of 50 A is measured in the U-phase top arm, a current of 40 A is measured in the V-phase bottom arm, and a current of 10 A is measured in the W-phase bottom arm in the state of the vector V1 in the same manner as in the case of FIG. 6, currents of the U-phase, the V-phase and the W-phase of the load are 50 A, −40 A and −10 A, respectively. When a current value is positive, it indicates the case where a current flows into the load, and when a current value is negative, it indicates the case where a current flows out of the load.

From the state of the vector V1, the U-phase top arm power transistor $Q_{UH}$ is set to Low level and the U-phase bottom arm power transistor $Q_{UL}$ is set to High level to transition to the zero vector (000) where all of the U-phase, the V-phase and the W-phase are Low level. Immediately after the transition to the zero vector (000), a current flowing through the load circuit 25 (inductor) does not change abruptly, and therefore a current flows through the diode D12 (see FIG. 5) connected in parallel with the U-phase bottom arm power transistor $Q_{UL}$.

At this time, because no current flows through the sense emitters of the U-phase power transistors $Q_{UH}$ and $Q_{UL}$, the current measurement circuits CM11 and CM12 of the U-phase power transistors $Q_{UH}$ and $Q_{UL}$ cannot measure any current. However, because currents flow through the V-phase bottom arm power transistor $Q_{VL}$ and the W-phase bottom arm power transistor $Q_{WL}$, currents can be measured using the current measurement circuits CM22 and CM32 of the power transistors $Q_{VL}$ and $Q_{WL}$. In this case, currents flowing through the power transistors $Q_{VL}$ and $Q_{WL}$ are measured as −40 A and −10 A, respectively, and because the sum of currents flowing through the U-phase, the V-phase and the W-phase is zero, a current flowing through the U-phase (current flowing through the diode D12) can be estimated as 50 A.

As described above, when output values from the current measurement circuits CM11 and CM12 are both zero, the control circuit 22 can estimate a current value flowing through the first terminal N1 of the load circuit 25 by using the sum of a current value measured by the current measurement circuit CM21 or CM22 and a current value measured by the current measurement circuit CM31 or CM32.

Likewise, from the state of the vector V1, the V-phase top arm power transistor $Q_{VH}$ is set to High level and the V-phase bottom arm power transistor $Q_{VL}$ is set to Low level to transition to the vector V2 where the U-phase and the V-phase are High level and the W-phase is Low level. Immediately after the transition to the vector V2, a current flowing through the load circuit 25 (inductor) does not change abruptly, and therefore a current flows through the diode D21 (see FIG. 5) connected in parallel with the V-phase top arm power transistor $Q_{VH}$.

At this time, because no current flows through the sense emitters of the V-phase power transistors $Q_{VH}$ and $Q_{VL}$, the current measurement circuits CM21 and CM22 of the V-phase power transistors $Q_{VH}$ and $Q_{VL}$ cannot measure any current. However, because currents flow through the U-phase top arm power transistor $Q_{UH}$ and the W-phase bottom arm power transistor $Q_{WL}$, currents can be measured using the current measurement circuits CM11 and CM32 of the power transistors $Q_{UH}$ and $Q_{WL}$. In this case, currents flowing through the power transistors $Q_{UH}$ and $Q_{WL}$ are measured as 50 A and −10 A, respectively, and because the sum of currents flowing through the U-phase, the V-phase and the W-phase is zero, a current flowing through the V-phase (current flowing through the diode D12) can be estimated as −40 A.

Likewise, from the state of the vector V2, the W-phase top arm power transistor $Q_{WH}$ is set to High level and the W-phase bottom arm power transistor $Q_{WL}$ is set to Low level to transition to the zero vector (111) where all of the U-phase, the V-phase and the W-phase are High level. Immediately after the transition to the zero vector (111), a current flowing through the load circuit 25 (inductor) does not change abruptly, and therefore a current flows through the diode D21 (see FIG. 5) connected in parallel with the V-phase top arm power transistor $Q_{VH}$. Further, a current flows through the diode D31 (see FIG. 5) connected in parallel with the W-phase top arm power transistor $Q_{WH}$.

At this time, because a current flows through the U-phase top arm power transistor $Q_{UH}$, the current can be measured using the current measurement circuit CM11 of the power transistor $Q_{UH}$. However, because no current flows through the V-phase power transistors $Q_{VH}$ and $Q_{VL}$ and the W-phase power transistors $Q_{WH}$ and $Q_{WL}$, it is not possible to measure currents using the V-phase and the W-phase current measurement circuits. Accordingly, it is not possible to estimate the current values of all of the U-phase, the V-phase and the W-phase.

In this case, the current values of the V-phase and the W-phase are estimated using a circuit equation. When current values of the three phases measured in any of the vector V1, the vector V2 and the zero vector (000) are $I_{U0}$, $I_{V0}$ and $I_{W0}$ (the timing of measurement is t=0), a given inductance of the load circuit 25 is L, a potential difference between the first voltage Vcc and the second voltage Vss is $V_{BUS}$, the switching states of the U-phase, the V-phase and the W-phase are $S_U(t)$, $S_V(t)$ and $S_W(t)$, (a binary function where Low (L) level is 0 and High (H) level is 1 at time t), the current values $I_U(\tau)$, $I_V(\tau)$ and $I_W(\tau)$ of the U-phase, the V-phase and the W-phase at time τ are respectively represented as follows.

$$I_U(\tau) = \frac{V_{BUS}}{3L} \int_0^\tau 2S_U(t) - S_V(t) - S_W(t)dt + I_{U0} \quad \text{Equation 1}$$

$$I_V(\tau) = \frac{V_{BUS}}{3L} \int_0^\tau 2S_V(t) - S_U(t) - S_W(t)dt + I_{V0} \quad \text{Equation 2}$$

$$I_W(\tau) = \frac{V_{BUS}}{3L} \int_0^\tau 2S_W(t) - S_U(t) - S_V(t)dt + I_{W0} \quad \text{Equation 3}$$

The current values $I_{U0}$, $I_{V0}$ and $I_{W0}$ are values measured in the past using the respective current measurement circuits, and those values are stored in the control circuit 22. The switching states $S_U(t)$, $S_V(t)$ and $S_W(t)$ are signals generated by the control circuit 22, and therefore the control circuit 22 have those values. Further, the value of the inductance L of the load circuit 25 is given in advance to the control circuit 22. The value of the potential difference $V_{BUS}$ is measured by an AD converter through a voltage divider resistor or the like or given in advance to the control circuit 22. In the case of the zero vector (111), the current values $I_U(\tau)$, $I_V(\tau)$ and $I_W(\tau)$ can be estimated using the above equations.

Specifically, when the output values from the current measurement circuits CM11 and CM12 are both zero and the output values from the current measurement circuits CM21 and CM22 are both zero, the control circuit 22 can estimate the current values flowing through the first terminal N and the second terminal N2 of the load circuit 25 by using the current value measured by the current measurement circuit CM31 or the current measurement circuit CM32, the voltage value applied to the load circuit 25 and the transfer function of the load circuit 25.

In the case where a current of one of the there phases can be measured as in the zero vector (111) shown in FIG. 9, a value measured by the current measurement circuit CM11 (see FIG. 5) is used for the current value of the U-phase, and the current values of the V-phase and the W-phase are estimated using the above equations. According to the Kirchhoff's law, a value obtained by inverting the sign of the current value of the U-phase and the sum of the current values of the V-phase and the W-phase are the same. The estimated current values of the V-phase and the W-phase may be corrected using such relationship.

For example, when the current value measured by the U-phase top arm current measurement circuit CM11 is 50 A and the results of calculating the currents of the V-phase and the W-phase by using the above equations are −44 A and −11 A, respectively, the sum of the current values of the V-phase and the W-phase is −55 A, and it is larger than −50 A, which is a value obtained by inverting the sign of the measured value of the U-phase, by 10%. In this case, in order that the sum of the V-phase and the W-phase becomes 50 A, the calculation result of currents of the V-phase and the W-phase may be multiplied by 50/55 so as to correct the currents of the V-phase and the W-phase to −40 A and −10 A, respectively. In this way, even when currents of two phases among the three phases cannot be measured, it is possible to estimate currents flowing through the respective phases.

As shown in FIGS. 7 to 9, there are two types of zero vectors: the case where all of the U-phase, the V-phase and the W-phase are set to Low level (the top arm is Low level) and the case where all of the U-phase, the V-phase and the W-phase are set to High level (the top arm is High level), and, in many cases, current measurement of two phases is possible in one of them, and current measurement of only one phase is possible in the other one. Because current measurement needs to be performed only once in one period (one pulse period; see FIG. 7), and it is generally performed during the zero vector period, current measurement may be performed during the zero vector period where current measurement is possible in two or more phases (which is the zero vector (000) in the case of this embodiment) among the two types of zero vectors, and the measurement results may be used for feedback control.

Further, by reducing or eliminating the period of one of the two zero vectors where current measurement is possible only in one phase and extending the period of the other zero vector where current measurement is possible in two or more phases accordingly, it is possible to facilitate measurement of currents without changing the voltage and current vectors applied to the load circuit.

In this embodiment, the control circuit 22 may estimate a current value flowing through the load circuit L as follows.

The control circuit 22 may set the larger one of the output values from the current measurement circuits CM11 and CM12 as a current value flowing through the first terminal N1 of the load circuit 25. Further, the control circuit 22 may set the larger one of the output values from the current measurement circuits CM21 and CM22 as a current value flowing through the second terminal N2 of the load circuit 25. Further, the control circuit 22 may set the larger one of the output values from the current measurement circuits CM31 and CM32 as a current value flowing through the third terminal N3 of the load circuit 25.

Further, the control circuit 22 may specify the current measurement circuit that measures the current of the power transistor based on commands to the gate drive circuits GD11, GD12, GD21, GD22, GD31 and GD32. Specifically, the control circuit 22 may determine the output value from the current measurement circuit of one of the power transistors $Q_{UH}$ and $Q_{UL}$ outputting an ON command as a current value flowing through the first terminal N1 of the load circuit 25. Likewise, the control circuit 22 may determine the output value from the current measurement circuit of one of the power transistors $Q_{VH}$ and $Q_{VL}$ outputting an ON command as a current value flowing through the second terminal N2 of the load circuit 25. Likewise, the control circuit 22 may determine the output value from the current measurement circuit of one of the power transistors $Q_{WH}$ and $Q_{WL}$ outputting an ON command as a current value flowing through the third terminal N3 of the load circuit 25.

Further, when the top arm power transistors $Q_{UH}$, $Q_{VH}$ and $Q_{WH}$ are all ON and two of the output values from the current measurement circuits CM11, CM21 and CM31 are larger than zero, the control circuit 22 may estimate current values flowing through the first to third terminals N1 to N3 of the load circuit 25 by using the output values from the current measurement circuits CM11, CM21 and CM31. Likewise, when the bottom arm power transistors $Q_{UL}$, $Q_{VL}$ and $Q_{WL}$ are all ON and two of the output values from the current measurement circuits CM12, CM22 and CM32 are larger than zero, the control circuit 22 may estimate current values flowing through the first to third terminals N1 to N3 of the load circuit 25 by using the output values from the current measurement circuits CM12, CM22 and CM32.

The control circuit 22 may control at least one of a pulse width, a duty ratio and a pulse density of drive voltages to be supplied to the power transistors $Q_{UH}$, $Q_{UL}$, $Q_{VH}$, $Q_{VL}$, $Q_{WH}$ and $Q_{WL}$ in accordance with the current values respectively measured by the current measurement circuits CM11, CM12, CM21 CM22, CM31 and CM32.

For example, when the maximum value of the current values respectively measured by the current measurement circuits CM11, CM12, CM21 CM22, CM31 and CM32 is smaller than a current command value (control target value), the control circuit 22 may extend the period where the power transistors $Q_{UH}$, $Q_{VH}$ and $Q_{WH}$ are ON and reduce the period where the power transistors $Q_{UL}$, $Q_{VL}$ and $Q_{WL}$ are ON to thereby increase the amount of current to be supplied to the load circuit 25. On the other hand, when the maximum value of the current values respectively measured by the current measurement circuits CM11, CM12, CM21 CM22, CM31 and CM32 is larger than a current command value (control target value), the control circuit 12 may reduce the period where the power transistors $Q_{UH}$, $Q_{VH}$ and $Q_{WH}$ are ON and extend the period where the power transistors $Q_{UL}$, $Q_{VL}$ and $Q_{WL}$ are ON to thereby decrease the amount of current to be supplied to the load circuit 25.

As described above, in the power control circuit 2 according to this embodiment, the power transistors that constitute the three-phase inverter circuit 21 are respectively provided with the current measurement circuits for measuring currents flowing through the power transistors. Each of the power transistors includes the main emitter and the sense emitter through which a current corresponding to a current flowing through the main emitter flows. Each of the current measurement circuits measures a current flowing through the corresponding power transistor by using a current flowing through the sense emitter included in each power transistor. Then, the control circuit 22 calculates a current value flowing through the load circuit 25 by using the output values from the respective current measurement circuits.

At this time, even when any of the current measurement circuits cannot measure a current value, the control circuit 22 can estimate a current value flowing through the load circuit 25 by calculation. Specifically, although there is a case where a current flowing through the load circuit 25 cannot be measured only by placing a current measurement circuit in a power transistor, by performing calculation in the control circuit 22 as described in this embodiment, it is possible to estimate a current value flowing through the load circuit 25 (each phrase) even when there is a current measurement circuit that cannot measure a current value.

As described above, because the power control circuit according to this embodiment can obtain a current flowing through the load circuit 25 by using the current measurement circuits respectively included in the power transistors, there is no need to use a current measurement circuit that uses an expensive current transformer, Hall element, magnetoresistive element and the like. It is thereby possible to reduce the cost for constructing the current measurement circuits.

Further, in the power control circuit 2 according to this embodiment also, the compensation circuit 16 may be included in each of the current measurement circuits (see FIG. 2). Because the compensation circuit 16 can keep the voltage of the sense emitter SE to be substantially the same as the voltage of the main emitter ME, it is possible to align the bias conditions of the main emitter ME and the sense emitter SE of the power transistor. Accordingly, it is possible to keep the sense ratio of the power transistor $Q_{UH}$ (the ratio of a current flowing through the main emitter ME and a current flowing through the sense emitter SE) constant regardless of the temperature, gate voltage and collector voltage. It is thereby possible to improve the accuracy of the current measurement circuit.

According to one embodiment described above, it is possible to provide a power control circuit including a low cost current measurement circuit.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The invention claimed is:

1. A power control circuit comprising:
    first to fourth transistors each having a main emitter, a collector, and a sense emitter;
    first to fourth diodes respectively provided to the first to fourth transistors, the first to fourth diodes each being coupled between the collector and the main emitter of a respective transistor of the first to fourth transistors;
    a first power supply coupled to the collectors of the first and third transistors;
    a second power supply coupled to the main emitters of the second and fourth transistors;
    a first node to be coupled to a load, the first node being coupled to the main emitter of the first transistor and the collector of the second transistor;
    a second node to be coupled to the load, the second node being coupled to the main emitter of the third transistor and the collector of the fourth transistor;
    first to fourth current measurement circuits respectively provided to the first to fourth transistors, the first to fourth current measurement circuits respectively include first to fourth amplifiers, the first to fourth current measurement circuits respectively include first to fourth resistors, the first to fourth current measurement circuits respectively include fifth to eighth transistors; and
    a control circuit that controls the first to fourth transistors based on outputs of the first to fourth current measurement circuits,
    wherein each of the first to fourth amplifiers has a first input and a second input, the first input being coupled to the sense emitter of the respective transistor of the first to fourth transistors, the second input being coupled to the main emitter of the respective transistor of the first to fourth transistors,
    wherein the first resistor is disposed between the sense emitter of the first transistor and a third node,
    wherein the second resistor is disposed between the sense emitter of the second transistor and a fourth node,
    wherein the third resistor is disposed between the sense emitter of the third transistor and a fifth node,
    wherein the fourth resistor is disposed between the sense emitter of the fourth transistor and a sixth node,
    wherein each of the fifth to eighth transistors is disposed between a respective node of the third to sixth nodes and the second power supply, a gate of each of the fifth to eighth transistors being coupled to an output of a respective amplifier of the first to fourth amplifiers,
    wherein each of the first to fourth current measurement circuits determines a current value based on a voltage of a respective node of the third to sixth nodes, and
    wherein when the second current measurement circuit indicates no current and the fourth current measurement circuit indicates a current value, the control circuit determines that a current flows from the second diode to the fourth transistor through the load and estimates a current value from the first node to the second node using the current value outputted from the fourth current measurement circuit.

2. The power control circuit according to claim 1, the first to fourth current measurement circuits further comprising:
    fifth to eighth amplifiers each coupled to the respective node of the third to sixth nodes,
    wherein each of the first to fourth current measurement circuits determines a current value based on an output of a respective amplifier of the fifth to eighth amplifiers.

3. The power control circuit according to claim 1,
    wherein the first to fourth transistors each comprises ninth and tenth transistors,
    wherein an emitter of the ninth transistor is the main emitter and an emitter of the tenth transistor is the sense emitter, and
    wherein a collector of the ninth transistor is coupled to a collector of the tenth transistor and a gate of the ninth transistor is coupled to a gate of the tenth transistor.

4. The power control circuit according to claim 1, wherein the second power supply has lower voltage than the first power supply.

5. A power control circuit comprising:
    first to fourth MOS transistors each having a main source, a drain, and a sense source;
    first to fourth diodes respectively provided to the first to fourth MOS transistors, the first to fourth diodes each being coupled between the drain and the main source of a respective MOS transistor of the first to fourth MOS transistors;
    a first power supply coupled to the drains of the first and third MOS transistors;
    a second power supply coupled to the main sources of the second and fourth MOS transistors;
    a first node to be coupled to a load, the first node being coupled to the main source of the first MOS transistor and the drain of the second MOS transistor;

a second node to be coupled to the load, the second node being coupled to the main source of the third MOS transistor and the drain of the fourth MOS transistor;

first to fourth current measurement circuits respectively provided to the first to fourth MOS transistors and having first to fourth amplifiers, first to fourth resistors and fifth to eighth transistors; and a control circuit that controls the first to fourth MOS transistors based on outputs of the first to fourth current measurement circuits, wherein each of the first to fourth amplifiers has a first input and a second input, the first input being coupled to the sense source of a respective MOS transistor of the first to fourth MOS transistors, the second input being coupled to the main source of the respective MOS transistors of the first to fourth MOS transistors, wherein the first resistor is disposed between the sense source of the first MOS transistor and a third node, wherein the second resistor is disposed between the sense source of the second MOS transistor and a fourth node, wherein the third resistor is disposed between the sense source of the third MOS transistor and a fifth node, wherein the fourth resistor is disposed between the sense source of the fourth MOS transistor and a sixth node, wherein each of the fifth to eighth MOS transistors is disposed between a respective node of the third to sixth nodes and the second power supply, a gate of each of the fifth to eighth MOS transistors being coupled to an output of a respective amplifier of the first to fourth amplifiers, wherein each of the first to fourth current measurement circuits determines a current value based on a voltage of a respective node of the third to sixth nodes, and wherein when the second current measurement circuit indicates no current and the fourth current measurement circuit indicates a current value, the control circuit determines that a current flows from the second diode to the fourth MOS transistor through the load and estimates a current value from the first node to the second node using the current value outputted from the fourth current measurement circuit.

6. The power control circuit according to claim 5, the first to fourth current measurement circuits further comprising:

fifth to eighth amplifiers each coupled to the respective node of the third to sixth nodes, wherein each of the first to fourth current measurement circuits determines a current value based on an output of a respective amplifier of the fifth to eighth amplifiers.

7. The power control circuit according to claim 5, wherein the first to fourth MOS transistors each comprises ninth and tenth MOS transistors, wherein a source of the ninth MOS transistor is the main source and a source of the tenth MOS transistor is the sense source, and wherein a drain of the ninth MOS transistor is coupled to a drain of the tenth MOS transistor and a gate of the ninth MOS transistor is coupled to a gate of the tenth MOS transistor.

8. The power control circuit according to claim 5, wherein the second power supply has lower voltage than the first power supply.

9. The power control circuit according to claim 1, wherein when a current flows from the second diode to the third diode through the load, a current control circuit estimates a current value from the first node to the second node using ON/OFF histories of the first to fourth transistors and the first and second power supplies.

10. The power control circuit according to claim 5, wherein when a current flows from the second diode to the third diode through the load, a current control circuit estimates a current value from the first node to the second node using ON/OFF histories of the first to fourth MOS transistors and the first and second power supplies.

* * * * *